(12) United States Patent
Hamer et al.

(10) Patent No.: US 12,236,863 B2
(45) Date of Patent: Feb. 25, 2025

(54) OLED DISPLAY WITH PROTECTION CIRCUIT

(71) Applicants: OLEDWorks LLC, Rochester, NY (US); Fraunhofer-Gesellschaft zur Förderung der angewandten Forschung e.V., Munich (DE)

(72) Inventors: John Hamer, Rochester, NY (US); Jeffrey Spindler, Ontario, NY (US); Marina Kondakova, Kendall, NY (US); Bernd Richter, Dresden (DE); Philipp Wartenberg, Dresden (DE); Gerd Bunk, Dresden (DE); Uwe Vogel, Dresden (DE)

(73) Assignees: OLEDWorks LLC, Rochester, NY (US); Fraunhofer-Gesellschaft e.V., Munich (DE)

( * ) Notice: Subject to any disclaimer, the term of this patent is extended or adjusted under 35 U.S.C. 154(b) by 465 days.

(21) Appl. No.: 17/601,531

(22) PCT Filed: Jan. 26, 2021

(86) PCT No.: PCT/US2021/015038
§ 371 (c)(1),
(2) Date: Oct. 5, 2021

(87) PCT Pub. No.: WO2021/154693
PCT Pub. Date: Aug. 5, 2021

(65) Prior Publication Data
US 2022/0208871 A1 Jun. 30, 2022

Related U.S. Application Data

(60) Provisional application No. 63/054,387, filed on Jul. 21, 2020, provisional application No. 62/966,757, filed on Jan. 28, 2020.

(51) Int. Cl.
*G09G 3/3233* (2016.01)
*H10K 50/13* (2023.01)
(Continued)

(52) U.S. Cl.
CPC ........... *G09G 3/3233* (2013.01); *H10K 50/13* (2023.02); *H10K 50/19* (2023.02); *H10K 50/852* (2023.02);
(Continued)

(58) Field of Classification Search
CPC .... G09G 3/3233; H10K 50/13; H10K 50/828; H10K 50/852; H10K 59/12;
(Continued)

(56) References Cited

U.S. PATENT DOCUMENTS 5,764,077 A 6/1998 Andresen et al.
6,392,617 B1* 5/2002 Gleason ............... G09G 3/3233
345/82
(Continued)

FOREIGN PATENT DOCUMENTS

CN 100483728 C 4/2009
CN 101621198 A 1/2010
(Continued)

OTHER PUBLICATIONS

Taiwan Office Action of Sep. 8, 2023.
(Continued)

*Primary Examiner* — Ratisha Mehta
*Assistant Examiner* — Brad A Knudson

(57) ABSTRACT

A display comprising a light emitting OLED stack on top of a silicon-based backplane with individually addressable pixels and control circuitry wherein the control circuitry of the silicon-based backplane comprises at least one driving transistor where a first terminal of the driving transistor is electrically connected to an external power source VDD, and
(Continued)

the second terminal of the driving transistor is electrically connected to the bottom electrode of the OLED stack; wherein the gate of the driving transistor is controlled by a data signal which supplied by a scan transistor controlled by a signal from select line SELECT1; and the control circuitry additionally comprises a protection circuit comprising a bipolar junction transistor. There can be a switch transistor between the scan transistor and the gate of the driving transistor for microdisplay applications. The OLED stack can comprise two or more OLED light-emitting units.

22 Claims, 11 Drawing Sheets

(51) Int. Cl.
  H10K 50/19 (2023.01)
  H10K 50/852 (2023.01)
  H10K 59/12 (2023.01)
  H10K 59/121 (2023.01)
  H10K 59/123 (2023.01)
  H10K 59/131 (2023.01)
  H10K 59/32 (2023.01)
  H10K 59/80 (2023.01)
  H10K 102/00 (2023.01)
(52) U.S. Cl.
  CPC ......... H10K 59/12 (2023.02); H10K 59/1213 (2023.02); H10K 59/123 (2023.02); H10K 59/131 (2023.02); H10K 59/32 (2023.02); H10K 59/876 (2023.02); G09G 2300/0426 (2013.01); G09G 2300/0842 (2013.01); G09G 2300/0861 (2013.01); G09G 2330/04 (2013.01); H10K 2102/3026 (2023.02)
(58) Field of Classification Search
  CPC ............. H10K 59/1213; H10K 59/123; H10K 59/131; H10K 59/32; H10K 59/876; H10K 50/19
  See application file for complete search history.

(56) References Cited

U.S. PATENT DOCUMENTS

| | | | |
|---|---|---|---|
| 6,580,657 B2 | 6/2003 | Sanford et al. | |
| 6,872,472 B2 | 3/2005 | Liao et al. | |
| 7,273,663 B2 | 9/2007 | Liao et al. | |
| 7,315,292 B2 | 1/2008 | Yamashita | |
| 7,384,810 B2 | 6/2008 | Tai et al. | |
| 8,692,821 B2 | 4/2014 | Park | |
| 9,059,123 B2 | 6/2015 | Hekmatshoartabari et al. | |
| 9,066,379 B2 | 6/2015 | Kreye et al. | |
| 9,281,487 B2 | 3/2016 | Kim et al. | |
| 9,293,912 B2 | 3/2016 | Parthasarathy et al. | |
| 9,299,817 B2 | 3/2016 | Yoo et al. | |
| 9,379,346 B2 | 6/2016 | Forrest et al. | |
| 9,489,886 B2 | 11/2016 | Sarma et al. | |
| 9,741,957 B2 | 8/2017 | Jung et al. | |
| 10,223,972 B1 | 3/2019 | Kuang et al. | |
| 10,510,973 B2 | 12/2019 | Yamamoto et al. | |
| 10,685,600 B2 | 6/2020 | Matsueda | |
| 10,827,582 B2 | 11/2020 | Mao et al. | |
| 10,978,002 B2 | 4/2021 | Yue et al. | |
| 11,011,586 B2 | 5/2021 | Fan et al. | |
| 11,289,669 B2 | 3/2022 | Yang et al. | |
| 2001/0005159 A1 | 6/2001 | Matsumoto | |
| 2001/0045929 A1 | 11/2001 | Prache et al. | |
| 2002/0084463 A1 | 7/2002 | Sanford et al. | |
| 2003/0170491 A1* | 9/2003 | Liao ........................ | H05B 45/60 257/88 |
| 2005/0230757 A1 | 10/2005 | Nagasawa et al. | |
| 2006/0044229 A1 | 3/2006 | Yamazaki et al. | |
| 2006/0221251 A1 | 10/2006 | Omata et al. | |
| 2006/0240277 A1 | 10/2006 | Hatwar et al. | |
| 2007/0001588 A1 | 1/2007 | Boroson et al. | |
| 2007/0046189 A1 | 3/2007 | Hatwar et al. | |
| 2007/0126665 A1 | 6/2007 | Kimura | |
| 2007/0241664 A1 | 10/2007 | Sakamoto et al. | |
| 2008/0169822 A1 | 7/2008 | Kwak | |
| 2008/0316659 A1 | 12/2008 | Oguzman et al. | |
| 2009/0108738 A1 | 4/2009 | Kwak | |
| 2009/0201231 A1 | 8/2009 | Takahara et al. | |
| 2009/0302741 A1 | 12/2009 | Fery | |
| 2010/0079507 A1 | 4/2010 | Yatabe et al. | |
| 2011/0037054 A1 | 2/2011 | Shieh et al. | |
| 2011/0199356 A1 | 8/2011 | Ochi et al. | |
| 2011/0291572 A1 | 12/2011 | Burroughes et al. | |
| 2012/0062536 A1 | 3/2012 | Park | |
| 2012/0230120 A1 | 9/2012 | Torii | |
| 2012/0249516 A1 | 10/2012 | Wacyk et al. | |
| 2013/0154498 A1 | 6/2013 | Missbach | |
| 2013/0277656 A1 | 10/2013 | Seo et al. | |
| 2014/0320550 A1 | 10/2014 | Liao et al. | |
| 2014/0332790 A1 | 11/2014 | Fadhel et al. | |
| 2015/0085407 A1 | 3/2015 | Chen et al. | |
| 2015/0270255 A1 | 9/2015 | Ikeda et al. | |
| 2016/0093605 A1 | 3/2016 | Sai | |
| 2017/0025630 A1 | 1/2017 | Seo et al. | |
| 2017/0213502 A1 | 7/2017 | Henry et al. | |
| 2017/0317107 A1 | 11/2017 | Kumar et al. | |
| 2018/0247591 A1* | 8/2018 | Kim .................... | G09G 3/3233 |
| 2018/0301090 A1 | 10/2018 | Kuang | |
| 2018/0331292 A1 | 11/2018 | Kalisz et al. | |
| 2019/0074470 A1 | 3/2019 | Takagi | |
| 2019/0304386 A1 | 10/2019 | Kim et al. | |
| 2020/0013978 A1 | 1/2020 | Tanaka | |
| 2020/0202973 A1 | 6/2020 | Shi et al. | |
| 2021/0091152 A1 | 3/2021 | Yang et al. | |

FOREIGN PATENT DOCUMENTS

| | | | |
|---|---|---|---|
| CN | 107068059 A | * 8/2017 | .......... G09G 3/3233 |
| CN | 108335672 A | 7/2018 | |
| CN | 109148725 A | 1/2019 | |
| CN | 107068059 B | 10/2019 | |
| CN | 110610975 A | 12/2019 | |
| CN | 111312908 A | 6/2020 | |
| EP | 1096466 A1 | 5/2001 | |
| EP | 1139454 A1 | 10/2001 | |
| EP | 3367373 A1 | 8/2018 | |
| JP | 2004-302289 A | 10/2004 | |
| JP | 2010-181823 A | 8/2010 | |
| JP | 2014-145851 A | 8/2014 | |
| JP | 2016-58423 A | 4/2016 | |
| JP | 2016-200828 A | 12/2016 | |
| JP | 2018-68117 A | 4/2018 | |
| JP | 2018-088417 A | 6/2018 | |
| JP | 2018-174246 A | 11/2018 | |
| JP | 2019-200435 A | 11/2019 | |
| KR | 10-2008-0064131 A | 7/2008 | |
| KR | 10-2013-0051542 | 5/2013 | |
| TW | I695363 B | 6/2020 | |
| WO | 2002/071379 A2 | 9/2002 | |
| WO | 2014/021159 A1 | 2/2014 | |

OTHER PUBLICATIONS

Attorney Translation of above Office Action. Previously uncited references highlighted on p. 3, 6.
Machine translation of CN 107068059B.
Japan Patent Office, Office Action of May 21, 2024.
Machine translation of JPO Office Action of May 21, 2024—p. 3-5, references in previous IDS forms crossed out.
JP 2004-302289 machine translation.
JP 2019-200435 machine translation.
Translation of Taiwan Office Action.
Google translation of CN 111312908.
Ali et al, "Recent advances in small molecule OLED-on-Silicon microdisplays", Proc. of SPIE vol. 7415 74150Q-1, 2009.

(56) References Cited

OTHER PUBLICATIONS

Jang et al, J. Information Display, 20(1), 1-8 (2019).
Fujii et al, "4032ppi High-Resolution OLED Microdisplay", SID 2018 DIGEST, p. 613; US2019/0259337.
Vogel et al, SID 2017 Digest, Article 77-1, pp. 1125-1128.
Vogel et al, 2018 48th European Solid-State Device Research Conference, p. 90, Sep. 2018.
Wartenberg et al, "High Frame-Rate 1' WUXGA OLED Microdisplay and Advanced Free-Form Optics for Ultra-Compact VR Headsets", SID Proceedings, 49 (1), Paper 40-5, 514 (2018).
Springer et al, Optics Express, 24 (24), 28131 (2016).
Spindler et al, "High Brightness OLED Lighting", SID Display Week 2016, San Francisco CA, May 23-27, 2016).
Ying, W., "Silicon Backplane Design for OLED-on-Silicon Microdisplay", MsE Thesis, Nanying Technological University, 2011.
O. Prache, Active Matrix Molecular OLED Microdisplays, Displays, 22, 49-56 (2001).
Han et al, "Advanced Technologies for Large-Sized OLED Displays", Chapter 3, 10.5772/intechopen.74869 (2018).
Kwak et al, "Organic Light-Emitting Diode-on-Silicon Pixel Circuit Using the Source Follower Structure with Active Load for Microdisplays", Japanese Journal of Applied Physics, 50, 03CC05 (2011).
Website: https://www.kopin.com/kopin-to-showcase-latest-advances-in-its-lightning-oled-microdisplay-line-up-at-ces-2020/; dated Jan. 7, 2020.
Website: https://hdguru.com/calibration-expert-is-10000-nits-of-brightness-enough/; dated Jul. 26, 2018.
Website: https://www.businesswire.com/news/home/20200630005205/en/Kopin-Announces-Breakthrough-ColorMax%E2%84%A2-Technology-Unparalleled-Color.
Japan Patent Office Action of Jan. 9, 2024 with cited references.
Machine translation of above office action. References (p. 6-7) cited in a previous IDS are crossed out.
JPO translation of JP 2016-58423A.
JPO translation of JP 2018-174246A.
JPO translation of JP 2014-145851A.
JPO translation of JP 2018-68117A.
JPO translation of JP 2010-181823A.
Korean Patent Office, Office Action of May 31, 2024.
Machine translation of Korean Office Action of May 31, 2024—p. 3, references in previous IDS forms crossed out.
Google translation of TW I695363.
Office Action, Sep. 24, 2024, Japan Patent Office, Pat. Appl. 2021-549824 (JP Equivalent of U.S. Appl. No. 17/601,531).
Machine translation, above Office Action, Sep. 24, 2024, Japan Patent Office, Pat. Appl. 2021-549824. Previously cited references crossed out, equivalents indicated where appropriate.
Office Action, Oct. 8, 2024, Japan Patent Office, Pat. Appl. 2024-124275 (Divisional application of JP equivalent of U.S. Appl. No. 17/601,202).
Machine translation, above Office Action, Oct. 8, 2024, Japan Patent Office, Pat. Appl. 2024-124275. Previously cited references crossed out, equivalents indicated where appropriate.
Machine Translation JP Patent Application 2016-200828.
CNIPA Office Action dated Jun. 26, 2024 for CN Application No. 202180002406.1 (CN counterpart of U.S. Appl. No. 17/601,202).
Machine (Google) translation of above Office action. pp. 11-12: US equivalents added, and previously reported references crossed out.
CNIPA Office Action dated Jun. 27, 2024 for CN Application No. 202180002415.0 (CN counterpart of U.S. Appl. No. 17/601,531).
Machine (Google) translation of above Office action. pp. 10-11: US equivalents added, and previously reported references crossed out.
Allowance Notice, Sep. 3, 2024, Japan Patent Office, Pat. Appl. 2024-124276 (Divisional application of JP equivalent of U.S. Appl. No. 17/601,202).
Machine translation, above Allowance Notice, Sep. 3, 2024, Japan Patent Office, Pat. Appl. 2024-124276. Previously cited references crossed out, equivalents indicated where appropriate.
Office Action, Aug. 6, 2024, Japan Patent Office, Pat. Appl. 2021-549824 (JP Equivalent of U.S. Appl. No. 17/601,531).
Machine translation, above Office Action, Aug. 6, 2024, Japan Patent Office, Pat. Appl. 2021-549824. Previously cited references crossed out, equivalents indicated where appropriate.
WO 2014-021159 Machine translation (by WIPO).
CN 108335672 Machine translation (by Google).
JP 2018-088417 Machine translation (by JP Patent Office).
CN 101621198 Machine translation (by Google).
KR 10-2013-0051542 Machine translation (by KR Patent Office).

* cited by examiner

OLED DISPLAY WITH PROTECTION CIRCUIT

CROSS-REFERENCE TO RELATED APPLICATION

This application is the U.S. National Phase application under 35 U.S.C. § 371 of International Application No. PCT/US2021/015038, entitled "OLED DISPLAY WITH PROTECTION CIRCUIT" and filed on Jan. 26, 2021, which claims the benefit of U.S. provisional U.S. Application 62/966,757, entitled "STACKED OLED MICRODISPLAY WITH LOW-VOLTAGE SILICON BACKPLANE" and filed Jan. 28, 2020, as well as U.S. provisional U.S. Application 63/054,387, also entitled "STACKED OLED MICRODISPLAY WITH LOW-VOLTAGE SILICON BACKPLANE" and filed Jul. 21, 2020.

BACKGROUND

OLED displays, particularly OLED microdisplays, are of great interest and utility. Typically, a microdisplay is less than two inches diagonal (approx. 5 cm) down to an ultra-small display size of less than 0.25" diagonal. In most cases, the resolution of the microdisplay is high and the pixel pitch is usually 5 to 15 microns. First introduced commercially in the late 1990s, they are commonly used for rear-projection TVs, head-mounted displays, and digital camera view finders. In recent years, devices like smart watches have taken advantage of the high resolution and low power consumption of these displays. Microdisplays are expected to proliferate with the global market projected at 20% compound annual growth rate in the next few years. One of the trends driving this growth will be the increasing adoption of near-eye displays, augmented reality devices and virtual reality devices such as head-mounted displays (HMDs), head-up displays (HUDs), and electronic view finders (EVFs).

There are two main categories of microdisplays. The first is a projection microdisplay, which involves a highly magnified image projected onto a surface. Types of projection microdisplays include rear-projection TVs and compact data projectors. The second is a near-to-eye display (NED), which consists of a highly magnified virtual image viewed through an eyepiece (such as a virtual reality headset or camcorder viewfinder). These displays are increasingly being used in HMDs and HUDs, especially in the military and medical industries.

Both types of microdisplays offer significant advantages over conventional direct-view displays such as flat-panel LCDs. Microdisplay advantages include the ability to produce a large image from a very small, lightweight source display unit, making them easy to integrate into space-constrained technology, such as wearables; large pixel capacity, producing high resolution and clarity; and greater power-efficiency as compared to other display types. The higher the resolution and brightness, and the lower the power consumption, the better quality the microdisplay. The challenge for microdisplay makers, however, has been relatively high production costs, together with the need for high brightness and contrast and long operational lifetime.

Microdisplays can be made from a range of display technologies, including Liquid Crystal-On-Silicon (LCoS); Liquid Crystal Displays (LCD); Digital Micromirror Devices (DMD); Digital Light Processing (DLP); and more recently, MicroLED (Light Emitting Diode) and Organic Light Emitting Diode (OLED).

LCD has dominated the microdisplay market in recent years. LCD technology offers high brightness, relatively low cost, and a relatively simple manufacturing process. Using LCDs, device manufacturers have been able to reduce the size of microdisplay components over time. LCD displays are currently being used in some HMDs, HUDs, EVFs, and thermal-imaging glasses and wearables. However, LCD microdisplays require a light source, or a backlight, in order to create an image together with a liquid crystal array in order to modulate the light. This technology has limitations, such as polarization, color space, maximum luminance limitation, LC temperature sensitivity, viewing angles, LCD transmission and extinction ratio, system limited dimensions and others, which may not provide all of the desired performance characteristics.

Microdisplays based on microLED technology could provide advantages over LCD microdisplays, such as self-emission, a larger color gamut, wide viewing angles, better contrast, faster refresh rate, lower power consumption (image dependent), and wide operation temperature range. Currently, microLED microdisplays are based on a standard Gallium Nitride (GaN) wafer, adopted from standard LEDs. This approach has the potential to provide high luminance display devices without lifetime issues at a relatively low price. In general, the standard GaN wafer is patterned into arrays of micro-LEDs. The microLED display is then produced by an integration of the micro-LED array and transistors. However, this approach has several manufacturing concerns including monolithic formation of the micro-LEDs over the transistors, pixel spacing, color generation, and spatial uniformity due to variations of color and luminance between the individual microLEDs.

OLED technology shares many of the attractive features of microLED technology for microdisplays. It is self-emissive, has excellent image quality, is very efficient compared to LCD or LCoS, and has an ultra-high color rendition and wide color space. Self-emissive OLED devices have the important advantage over backlight devices (such as LCD) in that each pixel only produces the intensity required by the image, whereas backlighted pixels produce maximum intensity followed by absorption of the unwanted light. Moreover, formation of an OLED over the transistors is much easier and lower cost than formation of a microLED because OLED layers can be vacuum deposited or directly coated on the transistor backplane. On the other hand, OLEDs can have limited luminance and lifetime.

It is also important for the control circuitry in OLED microdisplays, which are sample-and-hold type displays, to address the problem of motion blur (see https://www.blurbusters.com/faq/oled-motion-blur/; "Why Do Some OLEDs Have Motion Blur?", dated Dec. 28, 2018 and https://www.soundandvision.com/content/motion-resolution-issue-oled-tvs, "Is Motion Resolution an Issue with OLED TVs", dated Jan. 15, 2015).

The only way to reduce motion blur caused by sample-and-hold is to shorten the amount of time a frame is displayed. This can be accomplished by using extra refreshes (higher Hz) or via black periods between refreshes (flicker). For OLED microdisplays, the best solution is to "shutter" the display image, either by turning off the entire active area at the same time or by a "rolling" technique, where only part of the displayed image is turned off at one time in a sequential manner. The "rolling" technique is preferred. The time that the pixels are turned off is very short and well below the threshold of detectability by the human eye in order to avoid perceivable flicker. This is accomplished in the control circuitry by the inclusion of a shuttering transistor, which when activated through a select line, prevents current from flowing through the OLED and turns the emission by the OLED pixel "off" for the desired period of time. In other words, the shuttering transistor is a switch transistor, in that it only turns the pixel "on" or "off" and does not regulate the voltage or current. However, this solution, where the pixels are turned off for part of the time that an image is displayed (generally referred to as the frame time), only increases the need for increased luminance by the OLED whenever it is "on" since it is the average luminance over the frame that is perceived by the eye. The shuttering to reduce motion blur can be applied to any method of supplying power to the OLED stack; for example, current control or PWM.

OLED displays and microdisplays that utilize silicon backplanes are very attractive from the standpoint of cost and manufacturability. See, for example, Ali et al, "Recent advances in small molecule OLED-on-Silicon microdisplays", Proc. of SPIE Vol. 7415 74150Q-1, 2006; Ying, W., "Silicon Backplane Design for OLED-on-Silicon Microdisplay", MsE Thesis, Nanying Technological University, 2011; Jang et al, J. Information Display, 20(1), 1-8 (2019); Fujii et al, "4032ppi High-Resolution OLED Microdisplay", SID 2018 DIGEST, p. 613; US2019/0259337; Prache, Displays, 22(2), 49 (2001); Vogel et al, 2018 48$^{th}$ European Solid-State Device Research Conference, p. 90, September 2018; and Wartenberg et al, "High Frame-Rate 1" WUXGA OLED Microdi splay and Advanced Free-Form Optics for Ultra-Compact VR Headsets", SID Proceedings, 49 (1), Paper 40-5, 514 (2018).

Displays, including microdisplays, can require very high luminance in order to be useful under all environmental conditions, such as outdoors in bright sunlight. For example, microdisplays, even under controlled environment conditions such as in VR googles, require very high luminance to create an immersive visual experience. For microdisplays, very high luminance allows the use of lower efficiency optics that are smaller, lighter weight, and less expensive, producing a headset that is more competitive.

In order to achieve high luminance from an OLED display, the power supplied to the OLED is often near or at the maximum limit for the OLED. A particular problem for microdisplays is that they also need to have extremely high resolution, requiring that the size of the individual pixels must be as small as possible and that the active (light-emitting) area of the microdisplay contain as many pixels as possible. This requires that the transistors in the control circuitry of the backplane be small, but yet of sufficient size to handle the required maximum voltages and currents without permanent damage or current leakage.

Generally, as transistors get smaller, they have lower voltage ratings due to their inability to handle higher power because of the leakage current and other failure mechanisms. Smaller, lower-voltage transistors have thinner insulation layers at the gate, so they have more static current leakage as well. WO2008/057372 discusses the problems and prior art associated with the reduction of pixel circuit size in microdisplays. See also, for example, O. Prache, Journal of the Society for Information Display, 10(2), 133 (2002); O. Prache, "Active Matrix Molecular OLED Microdisplays, Displays, 22, 49-56 (2001); and Howard et al, "Microdisplays based upon organic light emitting diodes", IBM J. of Res. & Dev., 45 (1), 15 (2001), which discuss the need for microdisplays on silicon backplanes that provide high luminance with a large contrast ratio at low voltage.

Moreover, when using MOSFET p-channel transistors to provide a constant current from a power source at $V_{DD}$ to an OLED with the cathode voltage at $V_{CATHODE}$, the total voltage difference must be large in order to power the transistor and turn the OLED "on" to high brightness. However, at these high voltages, if the current leakage through the transistor is large enough when trying to turn off the OLED to create a black pixel, the OLED would continue to emit because ($V_{anode}-V_{cathode}$) will remain greater than the OLED threshold voltage. In OLED displays, current leakage through the drive transistor(s) will reduce contrast because the OLED pixels will continue to emit light when they should remain dark. Contrast is the difference in light emission when the pixel should be "off", "black", or non-emitting (typically, the image signal Code Value (CV)=0) and when the pixel should be fully "on", "white", or at maximum emission (typically, image signal CV=255). This effect will cause pure blacks (no emission desired) to become grey (some emission occurs) and decrease the magnitude of the tonal scale between pure black and pure white. This is undesirable.

OLED based microdisplays often contain a protection circuit in MOSFET-based control circuitry of the backplane to limit the amount of power flowing through the transistors to prevent damage. It is desirable to include a protection circuit in the control circuitry of the backplanes of microdisplays with OLEDs because of the relatively high power required to cause emission from such devices. A protection circuit should at least maintain or "clamp" the voltage at the bottom electrode of the OLED so that it doesn't go below a desired voltage level when the OLED is not emitting. Such protection circuits may also be called "voltage maintenance" circuits.

In order to protect the low-voltage transistors present in the control circuitry and remain within the specified operation range of the transistors as set by the foundry, it would be desirable for the protection circuit to maintain a black level current (CV=0 or pixel is "off") at the bottom electrode of the stacked OLED for the pixel below 4 µA/cm2, or more desirably at 2 µA/cm2 or less for 3-unit stacked OLEDs with a threshold voltage Vth of approximately 7.5V. For 4-unit stacked OLED devices, similar black level currents are desired, and a typical Vth is approximately 10V.

There exists a need to increase the performance of OLED displays, particularly microdisplays, on silicon backplanes by utilizing OLED stacks that can provide high luminance. However, the control circuitry on the silicon backplane must be able to handle the higher voltage and current demands without significantly increasing in size in order to maintain resolution and pixel pitch within the active area of the OLED. In particular, the control circuity should maintain contrast by preventing or minimizing current leakage through the transistors as well as damage to the transistors because of the increased power demands.

It is common in the semiconductor foundry industry that manufactures backplanes that analog transistors with a 5V or less operating range are considered standard "Low Voltage" (LV) transistors. It is also common that there is generally a 10% safety limit on the voltage rating, allowing reliable operation without degradation of lifetime of the "5V transistors" up to 5.5V; this is high enough to allow for some degree of overvoltage in the OLED dynamic voltage range and the driving circuit overhead voltage. While the voltage limit applies generally between any pair of contacts to the transistor (gate, source, drain, body (also called bulk or well)), it specifically applies to the maximum gate-drain voltage such that the performance of the transistor remains within the specified range for typically 43,000 hours of operation under these conditions. Sometimes, depending on the design of the transistor, the voltage limit for other pairs of contacts can be higher (e.g., 7V) but this transistor is still referred to as a LV or 5V transistor. The 5V analog transistor is offered widely across the industry because of its compatibility with legacy TTL logic voltage levels for communications between Integrated Circuit (IC) chips. With the downward trend in the voltage for input-output communication (e.g., 3.3V and 1.8V standards) these 5V transistors are also occasionally referred to as Medium Voltage (MV) transistors, moving the LV label to the newer "lower-voltage" analog transistors. While relative labels like LV and MV may change over time, in this Patent application, the term LV or "low-voltage" refers to a 5V rated transistor or lower, and the term MV or 'medium-voltage" refers to transistors with voltage ratings over 5V. Higher voltage analog transistors are also commonly available, but the exact voltages are not as standardized across the IC fabrication industry as the 5V transistor. For example, higher voltage transistors are often needed for industries such as automotive.

Currently, silicon backplanes with low-voltage 5V drive transistors are available that use tandem (two light-emitting OLED units separated by one CGL) OLED stacks for light emission. See, for example, Cho et al, Journal of Information Display, 20(4), 249-255, 2019; https://www.ravepub-s.com/oled-silicon-come-new-joint-venture/, published 2018; Xiao, "Recent Developments in Tandem White Organic Light-Emitting Diodes", Molecules, 24, 151 (2019). Such examples are insufficient in luminance for the needs of the technology.

Currently, state-of-the-art OLED microdisplays do not provide as much luminance as desired. For example, a press release by one manufacturer of tandem OLED microdisplays describes full color products that may be able to deliver as much as 2.5k nits, but admits that 5k nits would be a more desirable goal (see https://www.kopin.com/kopin-to-showcase-latest-advances-in-its-lightning-oled-microdisplay-line-up-at-ces-2020/, dated Jan. 7, 2020). Some manufacturers propose that the goal should be 10k nits or higher (see https://hdguru.com/calibration-expert-is-10000-nits-of-brightness-enough/, dated Jul. 26, 2018). A recent press release of Jun. 20, 2020 (https://www.businesswire.com/news/home/20200630005205/en/Kopin-Announces-Breakthrough-ColorMax%E2%84%A2-Technology-Unparalleled-Color) describes a tandem (2-stack) OLED display which emits >1000 nits. It also announces that "further improvements in the brightness (>2000 nits) and color fidelity are expected through optimization of OLED deposition conditions. By incorporating a structure to enhance the output coupling efficiency, the brightness of the OLED microdisplay could be increased to >5000 nits within a couple of years".

One potential solution for increasing the total amount of light emitted from OLED devices is to stack multiple OLED units on top of each other, so total light emitted from the stack is the sum of the light emitted by each individual unit. However, while the total light emitted from such OLED stacks is additive based on the total number of individual OLED light-emitting units, the voltage required to drive the OLED stack is also additive based on the voltages to drive each independent OLED unit. For example, if a light-emitting OLED unit requires 3 V to produce 250 nits at a given current, then a stack of two such units will require 6V to deliver 500 nits at the same current, a stack of 3 units will require 9V to deliver 750 nits and so forth.

OLED stacks are well known; for example, U.S. Pat. Nos. 7,273,663, 9,379,346, 9,741,957; 9,281,487 and US2020/0013978 all describe OLED stacks with multiple stacks of light-emitting OLED units, each separated by intermediate connection layers or charge generation layers. Springer et al, Optics Express, 24 (24), 28131 (2016) reports OLED stacks with 2- and 3-light-emitting units, where each unit has a different color. OLED stacks of up to six light-emitting units have been reported (Spindler et al, "High Brightness OLED Lighting", SID Display Week 2016, San Francisco CA, May 23-27, 2016).

Han et al, "Advanced Technologies for Large-Sized OLED Displays", Chapter 3, 10.5772/intechopen.74869 (2018), describes the advances of three stack white OLED formulations as well as backplane technologies including those with two serially connected transistors, although separately and not in combination. This reference also notes that such two transistor backplanes are "difficult to adopt in large-sized high-resolution panels because of large line loads and a short charging time" and so, adapts a different kind of backplane circuitry for their devices.

Kwak et al, "Organic Light-Emitting Diode-on-Silicon Pixel Circuit Using the Source Follower Structure with Active Load for Microdisplays", Japanese Journal of Applied Physics, 50, 03CC05 (2011), describes a pixel circuit that has an overvoltage protection circuit. This reference notes that "an overvoltage protection circuit" is required to prevent the breakdown of the metal oxide semiconductor field-effect transistors (MOSFETs) because the operating voltage of OLEDs is higher than that of MOSFETs. In Kwak et al., the protection circuit utilizes a p-channel transistor which is connected to ground.

U.S. Pat. No. 9,066,379 also describe the use of a protection circuit.

Vogel et al, SID 2017 DIGEST, Article 77-1, pp 1125-1128 discloses the use of a protection circuit in a low-voltage OLED Si microdisplay to extend the OLED voltage operating range.

Other references that include over-voltage protection for OLEDS are disclosed in U.S. Pat. No. 6,580,657, WO2009072205 and CN200488960.

U.S. Pat. Nos. 9,059,123, 9,299,817, 9,489,886, US20080316659 and US20200202793 disclose the use of n-p junction diodes such as bipolar junction transistors in the pixel control circuits of OLED displays.

Thus, while increasing the number of OLED light-emitting units within an OLED can provide higher luminance in a microdisplay, in many applications it is not an option to increase the size of the control circuitry to be able to withstand higher power demands. There exists a need to provide small and compact pixel circuits that provide high luminance and contrast at power levels near or at maximum of the OLED, without damage to the circuitry.

SUMMARY

Described are displays comprising a light emitting OLED stack on top of a silicon-based backplane with individually addressable pixels and control circuitry wherein the control circuitry of the silicon-based backplane comprises at least one driving transistor where a first terminal of the driving transistor is electrically connected to an external power source $V_{DD}$, and the second terminal of the driving transistor is electrically connected to a segmented bottom electrode of the OLED stack; wherein the gate of the driving transistor is controlled by a data signal which supplied by a scan transistor controlled by a signal from select line SELECT1; and the control circuitry additionally comprises a protection circuit comprising a bipolar junction transistor.

The above display wherein there is a switch transistor between the scan transistor and the gate of the driving transistor.

Any of the above displays where the driving transistor is rated at 5V or lower or wherein the driving and switch transistor are both p-channel transistors.

Any of the above displays wherein the OLED stack comprises a single OLED light-emitting unit between the segmented bottom electrode and a top electrode or wherein the OLED stack comprises two or more OLED light-emitting units between the segmented bottom electrode and a top electrode. In either case, the OLED stack may form a microcavity where the physical distance between the segmented bottom electrode and the top electrode is constant across all pixels or wherein the top electrode is transparent or semi-transparent so that the OLED stack is top emitting or both. When there are two or more OLED light-emitting units, they may be each separated from each other by a charge-generation layer (CGL).

Any of the above displays wherein the bipolar junction transistor is an NPN transistor wherein the base is connected either to a voltage source $V_{PROTECT}$ or a current source $I_{PROTECT}$, the emitter is connected to a node connected to the bottom electrode of the OLED stack and the collector is connected to external power source or wherein the bipolar junction transistor is an NPN transistor wherein the base is isolated, the emitter is connected to a node connected to the bottom electrode of the OLED stack and the collector is connected to external power source or wherein the bipolar junction transistor is located in a separate well from the driving transistor.

The displays provide very high luminance and contrast with a small pixel-pitch dimension with good stability and lifetime.

DETAILED DESCRIPTION

Figure 1:
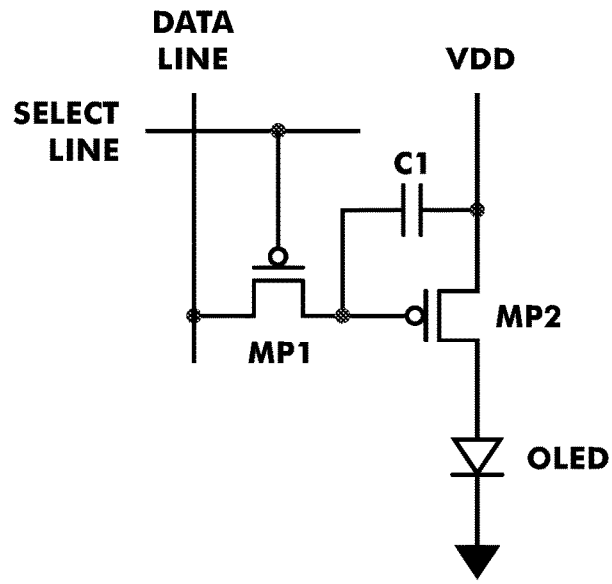
FIG. 1 shows a simple prior art control circuit for an OLED.

For the purposes of this disclosure, the terms "over" or "above" mean that the structure involved is located above another structure, that is, on the side opposite from the substrate. "Top", "uppermost" or "upper" refers to a side or surface further from the substrate while "bottom", "bottommost" or "bottom" refers to the side or surface closest to the substrate. Unless otherwise noted, "over" should be interpreted as either that the two structures may be in direct contact or there may be intermediate layers between them. By "layer", it should be understood that a single layer has two sides or surfaces (an uppermost and bottommost); in some instances, "layer" may represent multiple layers that are considered as a whole and is not limited to a single layer.

For light-emitting units or layers, R indicates a layer that primarily emits red light (>600 nm, desirably in the range of 620-660 nm), G indicates that a layer primarily emits green light (500-600 nm, desirably in the range of 540-565 nm) and B indicates a layer that primarily emits blue light (<500 nm, desirably in the range of 440-485 nm). It is important to note that R, G and B layers can produce some degree of light outside the indicated range, but the amount is always less than the primary color. Y (yellow) indicates that a layer that emits significant amounts of both R and G light with a much lesser amount of B light. "LEL" means light-emitting layer. Unless otherwise noted, wavelengths are expressed in vacuum values and not in-situ values.

An individual OLED light-emitting unit can produce a single "color" of light (i.e., R, G, B, or a combination of 2 or more primary colors such as Y, C (cyan), or W (white)). The single color of light may be generated within the OLED unit by a single layer with one or more emitters of the same color or multiple layers, each with the same or different emitters whose primary emission fall within the same color. A single OLED unit can also provide a combination of two colors (i.e., R+G, R+B, G+B) within a single OLED unit by having: one layer with a single emitter that emits two colors of light, one layer with two different emitters, or combinations of multiple separate layers, each emitting a single, but different, color. A single OLED unit may also provide white light (a combination of R, G and B) by having: one layer that emits all three colors of light or combinations of multiple separate layers, each emitting a single (but different) color, the sum of which is white. The individual OLED light-emitting units may have a single light-emissive layer or may have more than one light-emitting layer (either directly adjacent to each other or separated from each other by an interlayer). The individual light-emitting units may also contain various kinds of non-emitting layers such as hole transporting layers, electron-transporting layers, blocking layers and others known in the art to provide desirable effects such as promoting emission and managing charge transfer across the light-emitting unit.

Because OLED light-emitting units can comprise multiple layers, an individual unit is sometimes referred to as "stacks" which can be confused with an OLED device with multiple units. In this application, a "stacked" OLED has at least two OLED light-emitting units stacked on top of one another over a substrate so there are multiple sources of light within the device. In the stacked OLEDs of the invention, individual OLED light-emitting units are separated from each other by a charge-generation layer (CGL) and not by separately and independently controlled intermediate electrodes. To be considered an OLED light-emitting unit, it must be separated from another light-generating unit by a CGL. Thus, a light-emitting layer adjacent to one of the OLED light-emitting units but not separated from it by a CGL, is not considered to count as a separate unit. Within the stack, all or some of the individual OLED light-emitting units may be the same or they all may be different from each other. Within the OLED stack, the individual OLED light-emitting units can be placed in any order between the top and bottom cathodes. The stacked OLED may be monochromatic (every pixel of the OLED stack primarily emits the same color of light; for example, green light) or may have multimodal emission (either where every pixel emits 2 or more colors of light (for example, yellow or white) or where different pixels emits different colors of light so that the overall emission contains 2 or more colors of light).

In some cases, the threshold voltage ($V_{th}$) of the OLED stack can be estimated by linear extrapolation of the I-V curve after significant light emission begins back to the voltage axis. Because this method is not exact because I-V response curves for OLEDs may not be completely linear over their response ranges, values calculated in this manner are not exact. A general range for this metric is +/−10%. More accurately, the threshold voltage can be defined as the voltage where the current density is no more than 0.2 mA/cm$^2$ of the exposed anode layer, and there is at least some reliable detectable luminance; that is, at least 5 cd/A. This is the method used in this application.

In the following, transistors may be referred to as being "on" or "off". In an "off" transistor, the signal sent to the gate is intended so that no current will be passed through the terminals; in other words, the signal (typically, CV=0) is an indication that the signal calls for no current to pass through that transistor so that instead of being switched "off", the transistor is regulated to be "off". In such cases, even though a transistor may be "off", there still may be some current leakage. Likewise, in an "on" transistor, the signal sent to the gate is intended so that at least some current will be passed through the terminals; in other words, the signal (typically, CV=greater than 0 but less than 255) is an indication that the image calls for some degree of emission from that pixel so that instead of being switched "on", the transistor is regulated to be "on". In a similar way, pixels or OLEDs may be referred to as being "on" or "off" as according to the requirements of the image and so the appropriate signals are sent to the pixel or OLED.

Silicon backplanes are derived from a silicon wafer (also called a slice or substrate). They are a thin slice of semiconductor, such as a crystalline silicon (c-Si), used for the fabrication of integrated circuits. The wafer serves as the substrate for microelectronic devices built in and upon the wafer. It undergoes many microfabrication processes, such as doping, ion implantation, etching, thin-film deposition of various materials, and photolithographic patterning. Finally, the individual microcircuits are separated by wafer dicing and packaged as an integrated circuit. Wafers are grown from crystal having a regular crystal structure, with silicon having a diamond cubic structure with a lattice spacing. When cut into wafers, the surface is aligned in one of several relative directions known as crystal orientations. Silicon wafers are generally not 100% pure silicon, but are instead formed with an initial impurity doping concentration of boron, phosphorus, arsenic, or antimony which is added to the melt and defines the wafer as either bulk n-type or p-type. For background, see Chapter 7 in "Flat Panel Display Manufacturing", Souk, L., Ed., 2018. It is desirable that the silicon backplane be a single-crystal Si wafer.

In order to provide control circuitry for the operation of the stacked OLED, transistors along with other components such as capacitors, resistors, connecting wires or bus bars, and the like are provided on the surface of the silicon wafer. For example, see T Arai, "High Performance TFT Technologies for the AM-OLED Display manufacturing", Thesis, Nara Institute of Science and Technology, 2016; M. K. Han, Proc. of ASID '06, 8-12 Oct., New Delhi; U.S. Pat. Nos. 9,066,379; and 10,163,998. It should be understood that the transistors may or may not incorporate the silicon wafer as part of the structure or may be prepared from separate materials deposited on the surface as thin-film transistors (TFTs).

The transistors can be made using a wide variety of semiconductor materials. The characteristics of a silicon-based transistor depend on the silicon's crystalline state; that is, the semiconductor layer can be either amorphous silicon, microcrystalline silicon, or it can be annealed into polysilicon (including low-temperature polysilicon (LTPS) and laser annealing).

The manufacture of silicon backplanes with suitable control circuitry is a very well known, understood and predictable art. However, because of the cost and complexity of the manufacturing process and equipment, it is often not practical to build facilities to manufacture a particular backplane. Instead, a foundry model was been widely adopted in the industry where the functional characteristics of microelectronic devices have become more standardized. This standardization allowed design to be split from manufacture. A design that obeyed the appropriate design rules could be more easily and cheaply manufactured by different companies that had compatible manufacturing methods. For this reason, the control circuitry on silicon backplanes is generally limited to the use of standard components selected from a range of options provided by the manufacturer of the backplane. For example, a manufacturer of silicon backplanes may provide the option of incorporating various standard designs of transistors rated at 1.8V, 2.5V, 3.3V, 5V, 8V and 12V into a customer's design, but would not be able to provide (without great expense) transistors that are not included in the offered designs.

For the purposes of this application, "Low-Voltage" (LV) is defined as those analog microelectronic components that are sized, designed and rated to safely and reliably operate at 5V or less. "High-Voltage" (HV) microelectronic devices are generally considered to be in the range of 18-25V. "Medium-Voltage" (MV) microelectronic devices are generally considered to be those in between LV and HV. It should be noted that these voltage ratings are set by the manufacturers and the manufacturers do not recommend exceeding the set maximum voltage for each transistor.

Complementary metal-oxide-semiconductor (CMOS) technologies use p-type and n-type metal-oxide-semiconductor field-effect transistors (MOSFETs) to realize complex integrated circuits. Depending on the manufacturing process, there are different voltage domains available (i.e., 1.8V, 2.5V, 3.3V, 5V, 12V etc.). In all voltage domains, the MOSFET transistors have a drain, source, gate and bulk/well. The base of the MOSFET is the substrate; for a n-channel FET, the substrate is a p-type doped substrate or well with low doping rate; for a p-channel FET, the substrate is a n-type doped well with low doping rate. Source and drain regions are formed from highly doped regions with n or p-type for n-channel or p-channel FETs. The controlled channel is formed between the source and drain, isolated with a thin oxide and typically covered with a layer of poly-silicon acting as a gate. All four terminals of the FET (source, drain, gate, substrate/well) are connected by metal contacts to metal interconnection layers which eventually connect to the OLED.

The total emission area of a microdisplay is small and in order to achieve the necessary pixel pitch, the space available for the control circuitry for each pixel is limited. For a full-color microdisplay, the space occupied by the control circuit for each individual pixel should be no more than 100 square microns and preferably no more than 50 square microns. For a monochrome microdisplay where all pixels emit the same color, the space for the control circuitry can be 3-4× larger since fewer pixels are needed.

In a suitable low voltage 5V transistor, the maximum voltage between any pair of all terminals may not exceed 5V without damaging the device. A typical safety margin of 10% overvoltage is acceptable for a short period. A medium-voltage transistor rated at greater than 5V (for example, one rated at 7.5V) has in general the same setup as a 5V transistor but has a thicker gate oxide and larger geometries (channel width and length) to withstand higher voltages. Thus, MV transistors will generally be larger and occupy more space than a corresponding LV transistor.

Although transistors can be made in any size range without regard to their voltage rating, a low-voltage MOS transistor rated at 5V suitable for microdisplay applications has a total area of no more than 20 square microns, and preferably no more than 10 square microns. A suitable channel area (channel length×channel width) for a 5V transistor for microdisplay applications should be no more than 1 square micron and preferably, no more than 0.30 square micron. The two transistor contacts should be each be no more than 1 square micron and preferably no more than 0.30 square micron.

For the purposes of this application, a suitable BJT for the protection circuit is where the general setup is vertical for both NPN and PNP types. For a NPN BJT, the collector is formed as low doped deep n-well inside the common silicon substrate (bulk) with low p-doping. The base is formed as p-well inside the deep-n-well and is connected by a highly doped p-region. The emitter of the BJT is formed of a highly doped n-region inside the p-well. The typical size of the emitter region is about 500 nm×500 nm, with a preferable limit of no more than 0.30 square micron to allow small pixel sizes. The maximum voltage between any pair of all terminals of the BJT (bulk, base, emitter, collector) may not exceed 5V without damaging the device. A typical safety margin of 10% overvoltage is acceptable for a short period.

OLED displays (often called "AMOLEDs") consist of an active matrix of OLED pixels, which generate light (luminescence) upon electrical activation, that have been deposited or integrated onto a transistor or TFT array located on a silicon chip, where the array functions as a series of switches to control the current flowing to each individual pixel. Typically, this continuous current flow is controlled by at least two transistors at each pixel (to trigger the luminescence), with one transistor to start and stop the charging of a storage capacitor and the second to provide a voltage source at the level needed to create a constant current to the pixel.

This is illustrated in FIG. 1, which represents the simplest form of prior art AMOLED pixel design. The simplest AMOLED pixel which has pixel memory uses two transistors and one capacitor. The current-driving transistor MP2 is conventionally connected from the supply voltage $V_{DD}$ to the anode of OLED. One transistor (MP2) drives the current for the OLED and another transistor MP1 (also, known as a scan transistor) acts as a switch to sample and hold a voltage onto the storage capacitor C1 as shown. There is a data line (supplying $V_{DATA}$) that controls the current $V_{DD}$ passing through the driving transistor MP2. There is a select line that controls MP1 and thus, the charging of the capacitor C1. In general, the transistors have intrinsic capacitance, so additional capacitance may not be needed depending on the intrinsic capacitance of the transistors and the leakage currents through the transistors. In the figures after FIG. 1, any capacitors present are not necessarily shown in the drawings for clarity.

It has been found that the high voltage/current required by an OLED stack to provide high luminance can be safely handled by a control circuit that comprises a driving circuit with a driving transistor located between a power source $V_{DD}$ and the bottom electrode of an OLED stack and a protection circuit which additionally comprises a bipolar junction transistor. This arrangement allows for driving the OLED pixel without significant current leakage through the transistors so that high brightness is obtained without loss in contrast or damage to the LV circuitry.

Figure 2:
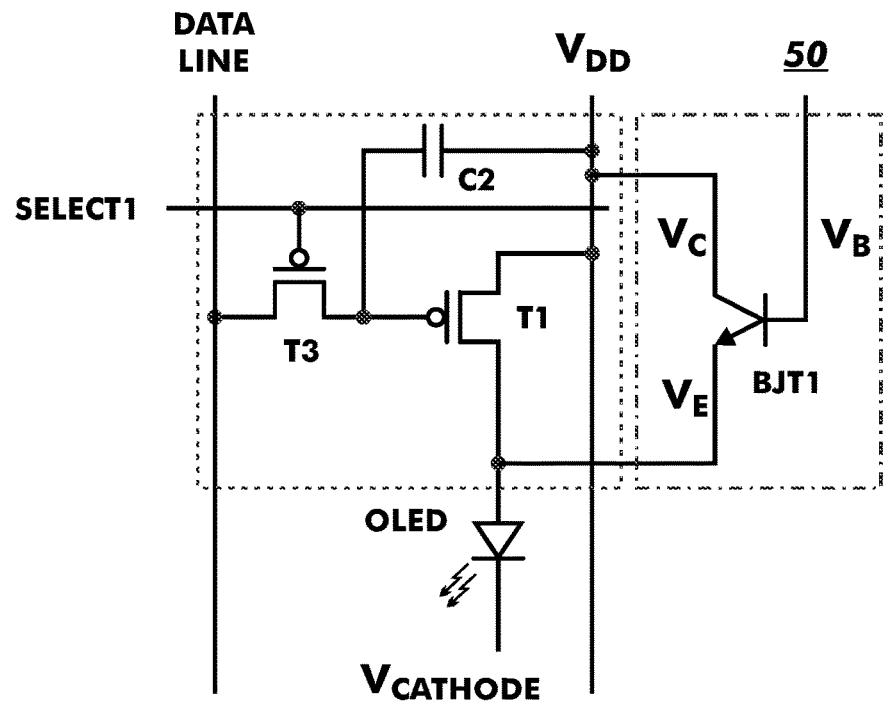
FIG. 2 shows a basic control circuit with a driving circuit and a protection circuit.

A basic control circuit arrangement suitable for a display of any size is shown in FIG. 2. This circuit contains a driving circuit, as indicated by the dotted lines, comprising driving transistor T1 (shown as a p-channel transistor) which is connected to $V_{DD}$ (external power source) on a first terminal (for p-channel transistors, the source) and connected on a second terminal (in p-channel transistors, the drain) to the bottom electrode of the OLED. The gate of the driving transistor T1 is controlled via the data line and an in-line selecting transistor T3 (a "scan" transistor), whose gate is controlled by a select line SELECT1. When T1 is selected to be "on" by placing a non-zero signal relative to $V_{DD}$ on the data line and turning "on" T3 via SELECT1 so that the non-zero signal from the data line flows to the gate of current flows to the bottom electrode of the OLED stack and it emits light. If T1 is selected to be "off" by placing a zero (or very small) signal relative to $V_{DD}$ on the data line and turning "on" T3, then no current will flow to the OLED stack.

In FIG. 2, the drive transistor of the driving circuit (T1) has the function for regulating the voltage and current flowing to the OLED pixel at an appropriate level according to the image being displayed. It is preferred that the driving transistor is a p-channel MOSFET transistor. The driving transistor can be LV (5V or less) or MV (>5V), preferably LV in order to minimize the space occupied by the control circuit. The scan transistor of the driving circuit (T3) has a function of supplying a data signal to the gate of the driving transistor, as well as charging an optional capacitor C2 if present, according to a scan signal applied to its gate.

FIG. 2 shows a storage capacitor C2 connected between $V_{DD}$ and a node on the data line between the scan transistor T3 and the gate of the drive transistor T1. When the scan transistor T3 is "on", the charge on this capacitor can be changed. However, the use of a capacitor such as C2 is optional and the circuit may have no capacitors or any number of capacitors as desired. The reference voltage for the capacitor can be $V_{DD}$ or some other voltage.

The basic control circuit shown in FIG. 2 also contains a protection circuit, as indicated by the dash-dot line, comprising a bipolar junction transistor (BJT). The protective circuit is designed to maintain the voltage at the anode of the OLED above a certain level whenever the OLED is intended to be "off" or non-emitting and might help to maintain high contrast. As the cathode voltage is decreased (more negative voltage) to enable the peak luminance of the OLED to be higher, the protection circuit is designed to provide additional current to the pixels displaying black or low luminance in order to protect the driving and switch transistors from voltage levels violating the maximum rating of the devices.

As shown in FIG. 2, the bipolar junction transistor BJT1 has a collector (c) which is connected to $V_{DD}$, an emitter (e) is connected to a node between T1 and the bottom electrode of the OLED stack and a base (b) is connected to a power source 50, which is either a voltage source $V_{PROTECT}$ or a current source $I_{PROTECT}$. One benefit of using a BJT in the protection circuit is the current amplification from the base-current to the collector-current. If desired, the collector of the BJT could be connected to a separate power source different from $V_{DD}$. The power source $V_{PROTECT}$ or $I_{PROTECT}$ can be common to all pixels. It should be noted that $V_{PROTECT}$ or $I_{PROTECT}$ may or may not be constant, but may vary depending on whether the OLED is intended to be emitting or not. This can be advantaged when used with a switch transistor to reduce the persistence of the display through shuttering. In FIG. 2, BJT1 is shown as a "NPN" type of BJT transistor (which is preferred), but could be a "PNP" transistor as well with the appropriate changes in design.

For a NPN type of BJT, whenever the emitter voltage $V_E$ at the bottom electrode of the OLED is greater than the base voltage $V_B$ and $V_B$ is less than the collector voltage $V_C$ ($V_E>V_B<V_C$), the BJT will be in shut-off mode and essentially no current is passed through the BJT. However, whenever the voltage $V_E$ at the bottom electrode of the OLED is less than the voltage $V_B$ and $V_B$ is less than $V_C$ ($V_E<V_B<V_C$), the BJT will be in forward-active mode. In this mode, the base-emitter junction is forward biased and the base-collector junction is reverse biased and the collector-emitter current will be approximately proportional to the base current.

Thus, in FIG. 2, if $V_C$ of BJT1 is $V_{DD}$ and $V_{PROTECT}$ (which is $V_B$) is set to be less than $V_{th}$ of the OLED above $V_{CATHODE}$, whenever the voltage at the bottom electrode $V_E$ is higher than $V_{th}+V_{CATHODE}$, BJT1 is "off", but whenever $V_E$ falls below $V_{th}+V_{CATHODE}$ (i.e., whenever T1 is "off"), the voltage at the bottom electrode is maintained near $V_{th}+V_{CATHODE}$. Thus, the protection circuit is designed to provide sufficient current whenever needed in order to protect the driving and switch transistors from having voltages across their terminals that exceed their rating whenever the cathode voltage decreases (more negative voltage) below a certain value. Moreover, by setting the base voltage B ($V_{PROTECT}$) below the turn-on voltage of the OLED ($V_{th}$ above $V_{CATHODE}$), power loss is minimized whenever the voltage delivered to the bottom electrode of the OLED is greater than or equal to $V_{th}$ above $V_{CATHODE}$.

In some embodiments utilizing the protection circuit shown in FIG. 2, the base voltage ($V_B$) of the BJT is isolated from any external power source. That is, there is no electrical connection between power source 50 ($V_{PROTECT}$ or $I_{PROTECT}$) and the base of the BJT. The BJT is physically present with the existing collector and emitter connections as shown in FIG. 2 but the base connection, while still present, is not connected to any external source. In such cases, $V_B$ is not intentionally maintained at any particular value nor is any voltage or current intentionally applied to it. Vs is allowed to "float" independently of the voltages $V_C$ and $V_E$, which remain as part of the active control circuitry that operates the OLED. Nevertheless, there may be parasitic current pathways within the backplane that bias the base internally with high impedance. Note that in this type of embodiment, $V_B$ may vary during the operation of the OLED because of the generation of parasitic currents within the circuitry.

Since the protective effect can be still observed when the base of the BJT is isolated and not connected to an external power source, so that the base voltage is not intentionally controlled, it is implied that the protection circuit is still providing some current and voltage control at the anode of the OLED in this embodiment. Without being limited to any particular theory or speculation, it is possible that a neighboring n-well (for example, the n-well of the driving transistor T1) could be a source of holes that migrate to the p-well (the base) of the BJT BJT1. Once these holes are in the base, they would diffuse across the depletion region to the n-type emitter contact (OLED anode pad) travelling through the Base Emitter diode in the forward direction. This would be complemented by the diffusion of thermally excited electrons from the emitter into the base, and then transported through the base and the depletion region into the collector which is facilitated by the large electric field potential between base and collector. In this scenario, holes from the neighboring n-wells provide the charges (holes) into the base that would normally come from the external $V_{PROTECT}$ connection. As the OLED anode voltage drops to very low levels (e.g., for showing black with stacked OLED units), then the potential differential between a neighboring n-well of one of the driving circuit transistors (which would be at $V_{DD}$) and the BJT base (at the OLED anode voltage) is very large, increasing the flow of holes into the BJT base from the drive-transistor well. This increase in base current, increases the emitter current due to the amplification by the BJT.

However, the protective effect provided by the protective circuit is different for each frame and may be required to be reset appropriately for each new frame of the image. When the BJT base is connected to an external power source and being actively controlled for each frame, this is not an issue. For the embodiments where the base of the BJT is isolated and not intentionally connected, the reset for each frame can be provided when the pixel is turned "off" by the scan transistor.

In other embodiments, the Vs of the BJT may be self-biased (sometimes referred to as having a 'Base Bias'). When BJTs are self-biased, there is no externally controlled input signal applied to the base of the BJT but rather, the signal applied to the base of the BJT is set by the value of a constant supply voltage (i.e., $V_{DD}$) and the value of any biasing resistors connected to the transistors. One method for achieving self-biasing of the base of the BJT is forming a "fixed base bias circuit". In this arrangement, the base of the BJT is connected to the constant power supply (i.e., $V_{DD}$) with a single current-limiting resistor. The current path through the deep n-well could provide such a resistance. As the $V_B$ of the BJT follows $V_E$ in response to changes in pixel brightness, the base-bias will vary and so will the base current ($I_B$) of the BJT, providing a protection current responsive to the OLED anode voltage. Alternatively, a simple voltage divider network can provide the required biasing voltage. Note that in this type of embodiment, the biasing voltages and resulting parasitic currents within each pixel will respond to the operation of the OLED. Such responses can provide effective protection for the transistors.

When used as part of a protection circuit, the BJT transistor design is smaller in pixel size. In addition, the inherent amplification factor for a forward-active mode BJT means that a relatively small parasitic current can generate a much larger protection current. Therefore, the current from the reference/protection voltage source is much smaller and the voltage drop on the reference voltage interconnection is dramatically reduced.

Stacked OLED formulations can be designed so that the voltage range from the black level (below Vth; e.g., 2 uA/cm$^2$) to the white level (20 mA/cm$^2$) is relatively constant and less than about 6V. This can result in a contrast of about 10,000:1 or greater, and can be slightly less due to current efficiency drop at the high end of the current densities. This voltage range is approximately within the allowable operating range of the LV transistors with the protection circuit becoming active only at the bottom end of the current range when the drive transistor stops the current. Thus, at the low current end of the range, the protection circuit additionally prevents the current density through the OLED from falling below about 2 uA/cm$^2$. However, it may also limit the ability to achieve higher contrast. In exchange for this slightly elevated black level and reduced contrast, the protection circuit allows pushing the pixel drive circuit by lowering the cathode voltage to achieve higher peak brightness or to compensate for efficiency loss due to OLED aging with assurance that the LV transistors are operating within their specified voltage range.

However, the control circuit shown in FIG. 2 may not be suitable for all microdisplay applications since there is no provision for providing a shuttering function necessary to minimize motion blur. In order to prevent or minimize motion blur by providing a shuttering function, a switch transistor can be added to the driving circuit that prevent currents flowing to the OLED without regard to the operation of the driving transistor (which controls the power supplied to its pixel); in particular, when the driving transistor is "on" (passing current). At the appropriate time for the pixel, the switch transistor can be selected so that the OLED pixel is turned "off" even if the image to be displayed requires that pixel to be "on" (and so, the driving transistor is "on"). This allows for all or rotating sections of pixels in the display to be "off" (non-emitting) during a single frame which minimizes the perception of motion blur in the microdisplay.

Figure 3A:
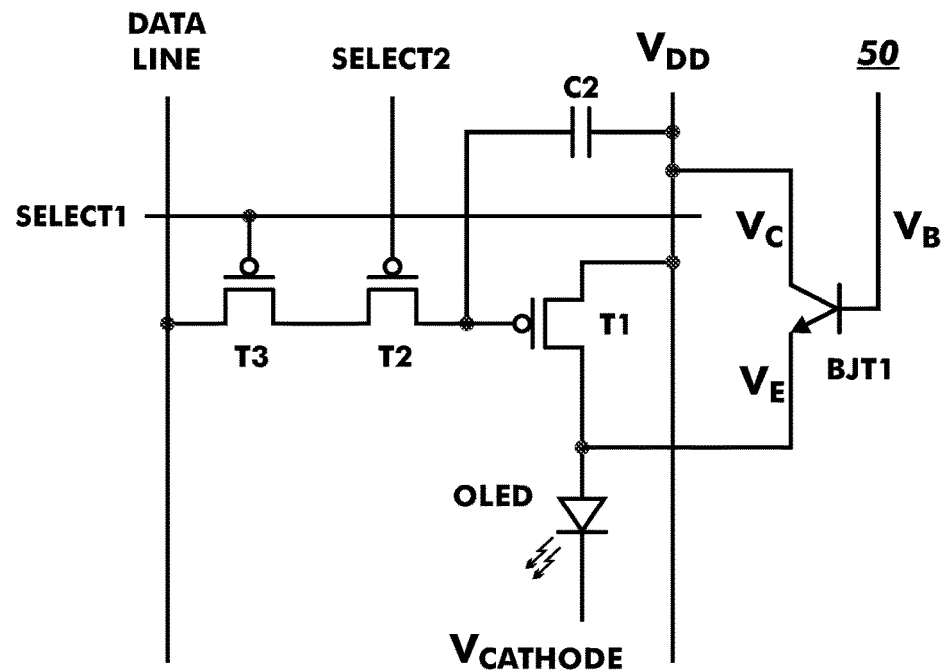
FIG. 3A shows an embodiment of the basic control circuit with an added switch transistor.

An embodiment of a control circuit with a switch transistor particularly suitable for a microdisplay application is shown in FIG. 3A. There is a "switch" transistor T2, whose gate is controlled by a signal from select line SELECT2, located along the data line between the scan transistor T3 and the driving transistor T1. As shown, one terminal (the source for a p-channel transistor) of the switch transistor T2 is connected to one terminal (the drain for a p-channel transistor) of the scan transistor T3 and the other terminal (the drain) of T2 is connected to the gate of the driving transistor T1. T3 and T2 are in series. In this embodiment, the purpose of the switch transistor, in combination with the other components of the circuit, is to switch the current flowing to the OLED pixel on and off in order to provide a shuttering function.

For example, during normal un-shuttered operation of a microdisplay to display an image, the scan transistor T3 is selected according to SELECT1 to allows the signal (according to the image) from the data line to flow to the gate of T1. This allows the pixel to emit. In some applications, the activation of T3 by SELECT1 may be along a row of pixels while the data lines supply an appropriate signal for each pixel along the row accordingly. During this time, T2 is selected according to the signal from SELECT2 to be "on" so that the data signal from T3 is passed to the gate of T1. In some applications, SELECT2 may be common to a column of pixels.

To supply a shuttering function, it is necessary to prevent the pixel from emitting for some short period of time when the pixel should normally be emitting. To create the shuttering period, T2 can be activated by a signal from SELECT2 so that, in cooperation with T3, the gate of T1 receives an "off" signal (i.e., CV=0). SELECT2 can be common across a number of pixels (desirably, a column of pixels) so that its signal is applied simultaneous to more than one pixel at a time so all pixels in that group do not emit. This is different from purpose of the scan transistor T3 which is only on for a very small part of the frame time (e.g., 1/1200 for a display with 1200 rows) in order to apply the data signal to gate of the driving transistor (and storage capacitor C2 if present) of each individual pixel. T2 and T3 operate independently of each other and their gates are controlled by different signal lines (SELECT1 and SELECT2). At some time during each frame, both can be "on", both can be "off" and one can be "on" while the other is "off".

A storage capacitor C2, which is optional, is connected between $V_{DD}$ and a node on the data line between the switch transistor T2 and the gate of T1. When the scan transistor T3 is "on" (T2 will also be "on" as well during this part of the operation), this capacitor can be charged so that the voltage at the gate of T1 is constant. In some embodiments, C2, if present, may be connected to a node between T3 and T2.

Figure 3B:
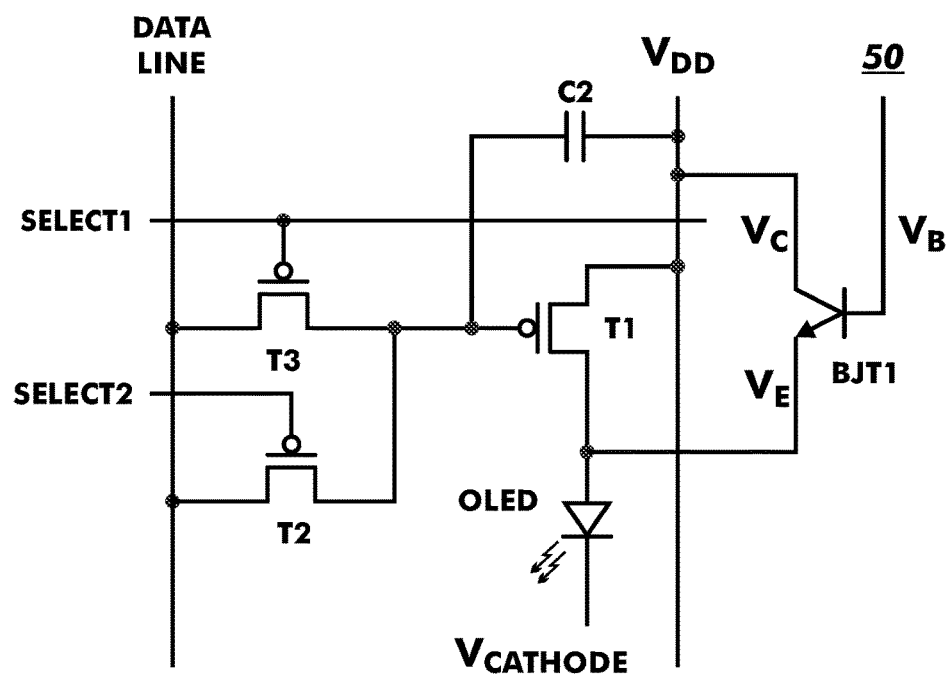
FIG. 3B shows an alternative arrangement for the added switch transistor.

FIG. 3B shows an alternative arrangement for a circuit with a switch transistor. In this arrangement, T3 and T2 are not connected in series but in parallel. The gate of T3 is controlled by SELECT1 and one terminal is connected to the data line and the other to T1 though a common node with T2. The gate of T2 is controlled by SELECT2 and one terminal is connected to the data line and the other to T1 though a common node with T3. In this embodiment, during normal operation, T2 would be "off" so the gate of T1 is supplied with the appropriate data signal from the data line through T3, as controlled by SELECT1, for each pixel. During the shuttering period, T3 would be "off", so the gate of T1 is supplied with the appropriate data signal (i.e., CV=0) from the data line through T2, as controlled by SELECT2, so that those pixels connected to SELECT2 do not emit.

In both of the embodiments shown in FIGS. 3A and 3B, T3 and T2 and SELECT1 and SELECT2 work together in synchrony to control the gate of T1. Basically, when the microdisplay is displaying an image normally, T1 is controlled according to T3 with T2 being set as not to interfere. However, during the shuttering period, T1 is controlled according to T2 with T3 set not to interfere.

For example, for the circuit shown in FIG. 3A where the SELECT1 runs parallel to the data line so in a very short period of time, it is possible to shutter a column of pixels by loading CV=0 into each pixel. In FIG. 3A, for shuttering one column for the "rolling shutter" function, the operation for shuttering each column one at a time would be; first, chose all rows by SELECT1 "on", then set the data line for one column to CV=0, and finally pulse SELECT2 to turn off a column.

Alternatively, for the circuit shown in FIG. 3A where C2 is connected to a node between T3 and T2, a global shuttering function would be; first, sequentially load all the data voltages on C2 (like normal) using T3, then start the emission by turning T2 "on" for the whole display by activating all SELECT2 lines. To stop emission, all data lines would be set to CV=0 at the desired time, followed by pulsing all SELECT1 lines to turn on all T3 transistors and stop the emission (shutter) of the display, and finally, close all T2 transistors and start again.

As is known in the art, MOSFET transistors require an intrinsic body diode connection to perform as desired. Due to the structure of a MOSFET transistor, a parasitic diode is inherently present and it can affect the operation of the transistor. Commonly, the intrinsic body diode is connected to a power source, either internally or externally, to apply a bias. These body connections are also referred as "bulk connections" or "transistor wells" as well as other terms.

Figure 4:
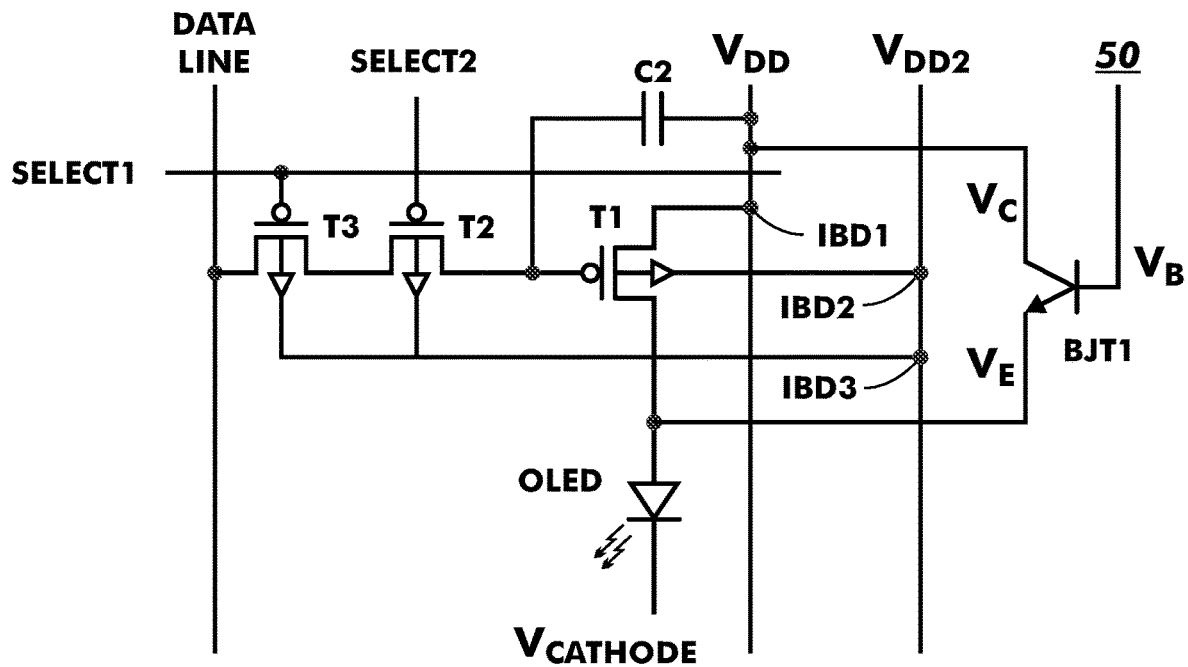
FIGS. 4 and 5 show different embodiments for the intrinsic body diode connections for the circuit shown in FIG. 3.

FIG. 4 shows one embodiment of FIG. 3A where IBD1, IBD2, and IBD3 are the intrinsic body diode connections (for T1, T2 and T3) to a separate voltage source $V_{DD2}$. These transistors can share the same well for the intrinsic body diode connection. However, the same power source $V_{DD}$ used to supply power to T1 could be used for the IBDs as well; that is $V_{DD}$ and $V_{DD2}$ are a common source.

However, it can be desirable that one or more of the transistors are floating in its own separate well on the Si backplane to avoid going outside the operating voltage range of any of the components. In particular, when both the driving transistor T1 and the switch transistor T2 are p-channel transistors, each transistor can be located in its own separate n-well. This permits a larger dynamic voltage range for the control of the OLED than can be achieved with both transistors in the same n-well. The use of isolated, floating or different wells for serially connected transistors is known in the art; for example, see U.S. Pat. Nos. 9,066,379, 5,764,077, 7,768,299, 9,728,528 and JP2016200828.

Figure 5:
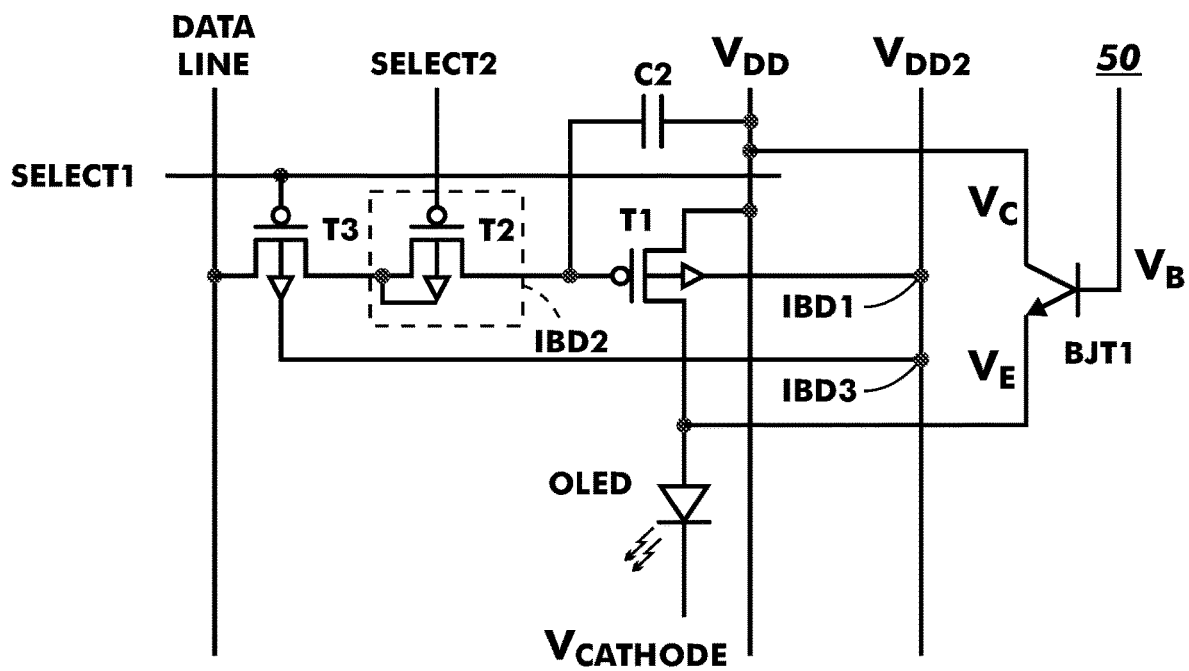

This is illustrated in FIG. 5, which is similar to FIG. 4, where T1 occupies one well biased through a connection to $V_{DD2}$ via IBD1 and T2 occupies a different well, as indicated by the dotted lines, which is biased by a different separate connection IBD2 to the transistor source. In the embodiment of FIG. 5, the same bias is not applied to each IBD and so, the n-wells are independent of each other.

Figure 6:
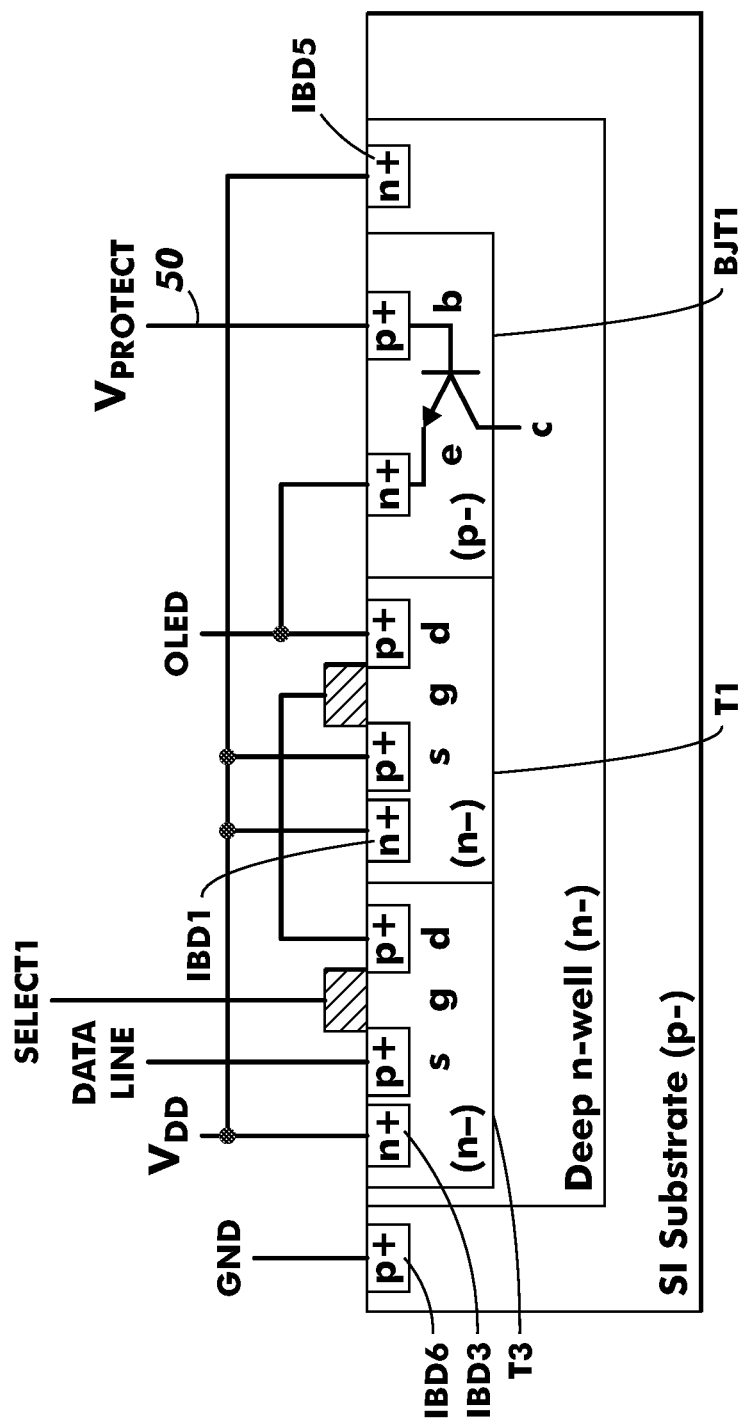
FIG. 6 shows a side view schematic for the intrinsic body diode connections for the circuit shown in FIG. 2.

FIG. 6 is a schematic cross-section representation of the transistor wells for the circuit shown in FIG. 2. Note that T1 and T3 may each be located in separate, but not isolated or floating, n-wells that are connected to $V_{DD}$ and all are separated from the p-well of BJT1 (a NPN BJT). For convenience, the source (s), gate (g) and drain (d) regions are marked for T1 and T3. Similarly, the emitter (e), base (b) and collector (c) regions are marked for BJT1. The collector (c) region of BJT1 is shown as being connected to $V_{DD}$ though the deep n-well, but it could alternatively be connected directly to $V_{DD}$ in some embodiments. FIG. 6 also indicates IBD5, which is the intrinsic body diode connection to $V_{DD}$ of the deep n-well of the Si substrate in which all of the transistors are located as well as IBD6, which is the intrinsic body diode connection to ground for the entire Si substrate. It should be noted that the BJT in the protection circuit could be either an NPN or PNP transistor. If the BJT is an NPN transistor then the transistor is in a p-well, whereas if the BJT is a PNP transistor, it will be in an n-well. The capacitor C2 is not shown in the cross-section for clarity.

Figure 7:
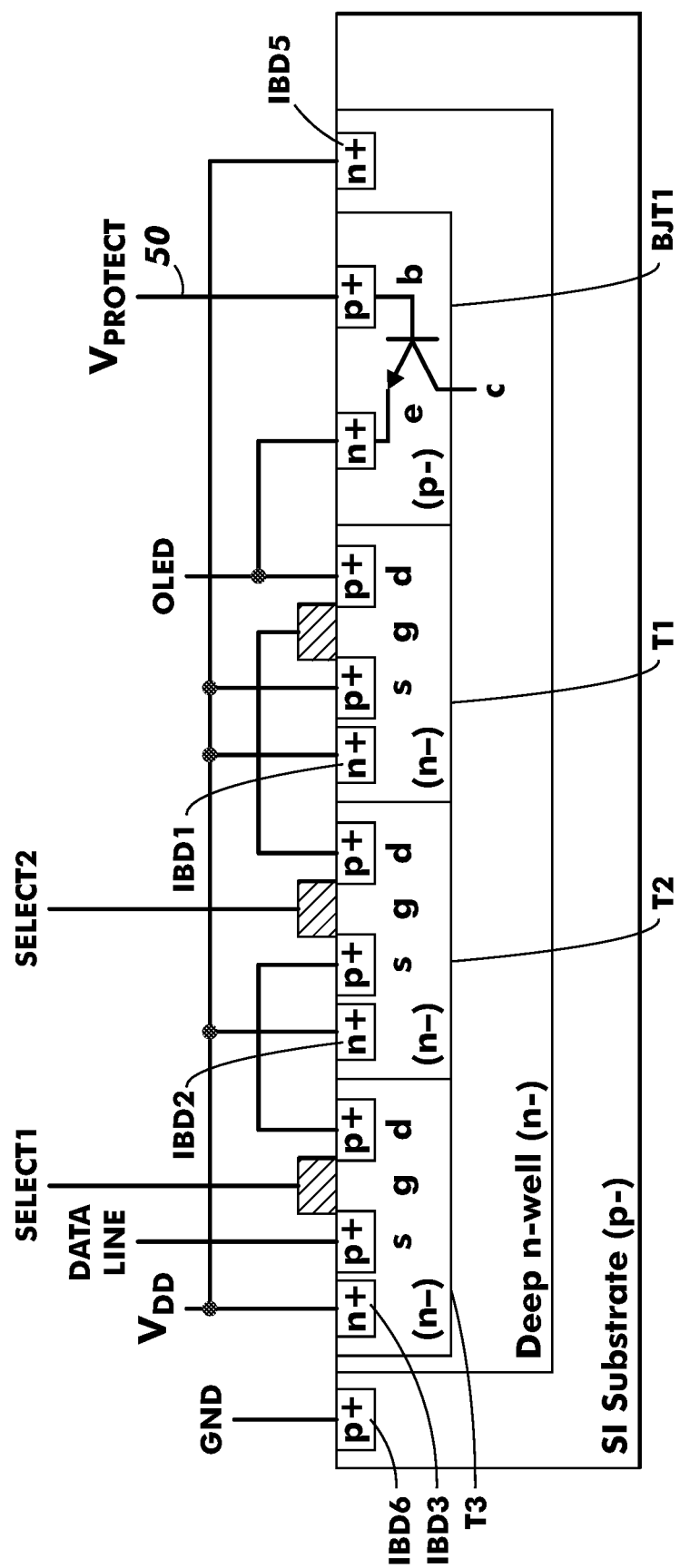
FIG. 7 shows a side view schematic for the intrinsic body diode connections for the circuit shown in FIG. 3A.

FIG. 7 is a schematic cross-section representation of the transistor wells for the circuit shown in FIG. 4. Note that T1, T2, T3 may each be located in separate, but not isolated or floating, n-wells that are connected to $V_{DD}$ and all are separated from the p-well of BJT1 (a NPN BJT).

Although only p-channel transistors are illustrated in FIGS. 2-7, n-channel transistors, or a mixture of n-channel and p-channel transistors can be used. In such cases, it will be necessary to rearrange the circuitry appropriately to account for the differences in polarity between n- and p-channel transistors. When all of the multiple transistors are of one type, then the multiple common transistors of the same type can share the same well to reduce the size of the design. However, to expand the operating range of the backplane circuit while observing the voltage limitations of the individual transistors, it may be necessary to put the transistors of the same type in separate well regions.

It is desirable that the switch transistor be a p-channel transistor. When the switch transistor is a p-channel transistor, its source is connected to one terminal of the scan transistor and its drain is electrically connected to the gate of the driving transistor. In some embodiments, it is desirable that both the driving and switch transistors are p-channel transistors where both are low-voltage transistors or the driving transistor is low-voltage and the switch transistor is medium- or high-voltage.

There may be intervening (other than the node that connects to capacitor) microelectronic components between the scan transistor and the switch transistor or between the switch transistor and the gate of the driving transistor. The intervening components may be in-line where the current between the scan transistor/the switch transistor/the gate of the driving transistor passes directly through the in-line component. There may also be other microelectronic components (not including the capacitor) that are indirectly electrically connected to any of the connections between the scan transistor/switch transistor/driving transistor gate so that the current also flows to this additional component.

The embodiments shown in FIGS. 2-7 have several advantages in their design and operation for driving an OLED microdisplay. In design, this circuit can be very compact because all transistors can be relatively small LV transistors, commonly found at most foundries. All transistors can be p-channel transistors with all the n-wells biased to $V_{DD}$ which eliminates the need for isolated or floating wells. These features can allow a very compact pixel circuit design for microdisplay designs with very high resolutions in small sizes.

In some embodiments, there may be a second drive transistor in the driving circuitry between the power source and the bottom electrode of the OLED. Having two or more serially connected drive transistors in the driving circuit allows for the power load to be shared over multiple transistors.

Figure 8:
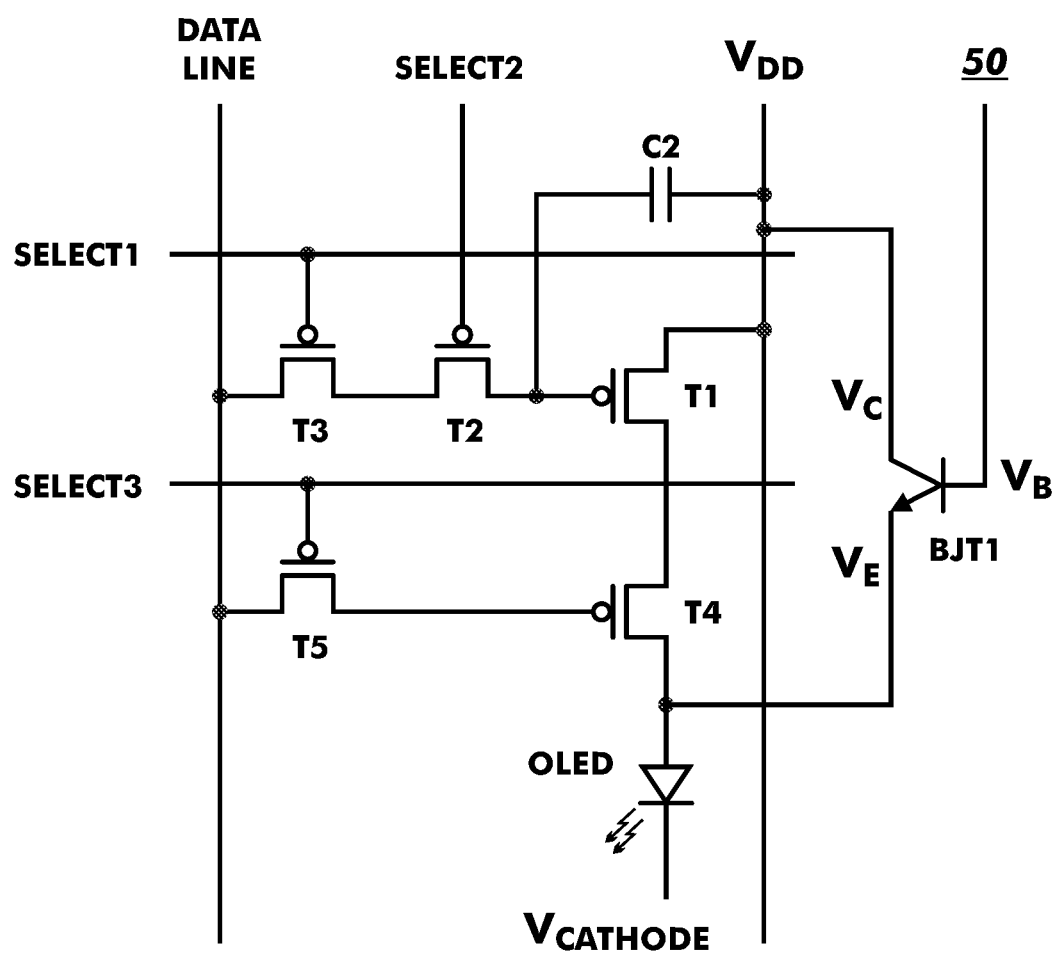
FIG. 8 shows a control circuit with two driving transistors in series controlled by a single data line where the gates of each driving transistor are separately controlled.

One embodiment of this arrangement is shown in FIG. 8 which shows a driving circuit with two drive transistors T1 and T4 connected in series between the power source $V_{DD}$ and the bottom electrode of the OLED. The gate of T1 is controlled via T3 and T2 as described in FIG. 3A. The gate of the additional drive transistor T4 is controlled via scan transistor T5, whose gate is controlled by SELECT3. This allows the timing of the current through both T1 and T4 to be independently controlled. There may be a second in-line switch transistor T6 (not shown) between T5 and the gate of T4 to allow shuttering of T4 in a manner similar to switch transistor T2 and drive transistor T1. The gate of T6 can be controlled by SELECT2 in common with T2 or a different signal line. It is also possible that T5 is connected to a different data line from T3.

Figure 9:
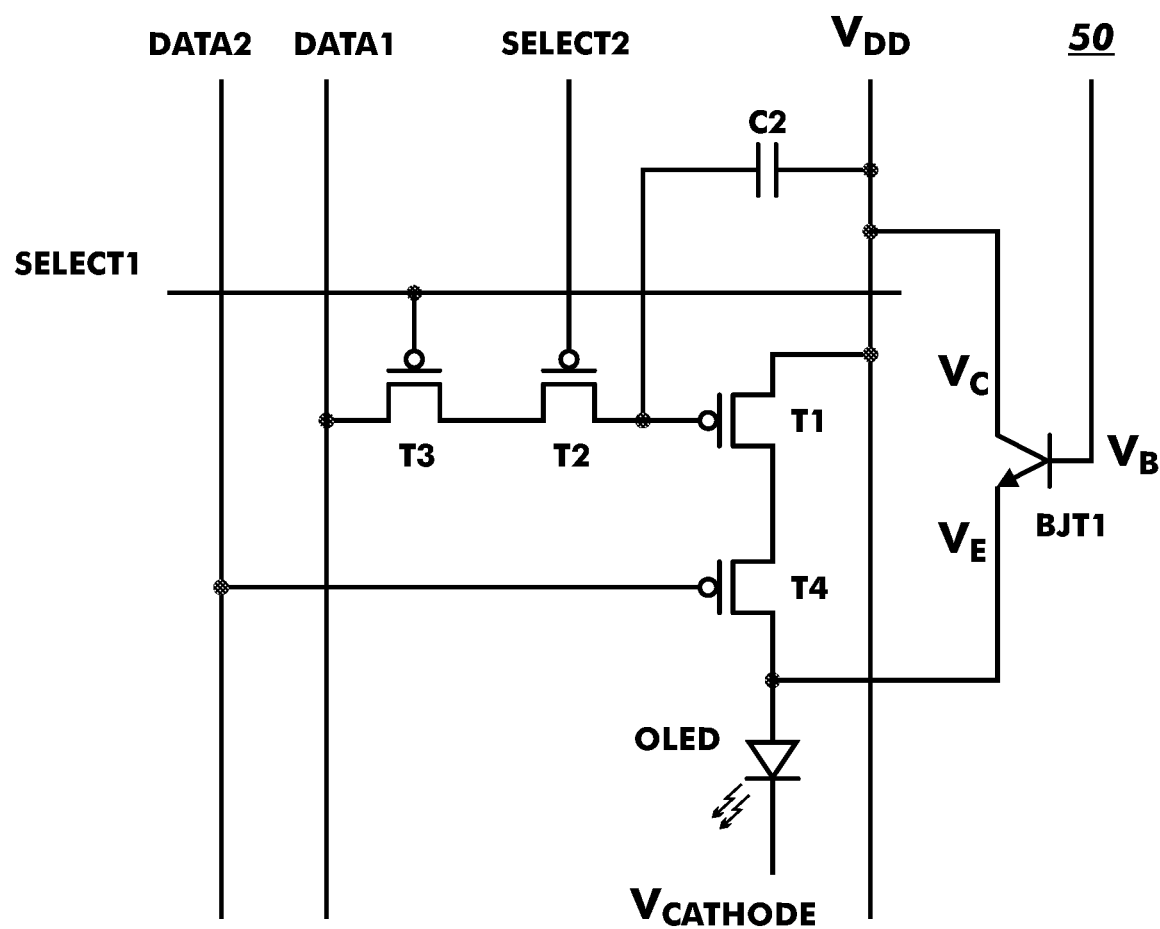
FIG. 9 shows a control circuit with two driving transistors in series, each controlled by separate data lines.

FIG. 9 shows another embodiment for the driving circuit with two drive transistors T1 and T4 connected in series. In this example, the gate of the first driving transistor T1 is connected to a first data line DATA1 via T3 and T2 as described in FIG. 3A. T4 is directly connected to a second data line DATA2. DATA1 and DATA2 are independent of each other. In different configurations, there is one DATA2 for each pixel, one DATA2 for each one row or column of pixels, or more preferably, one DATA2 for all pixels. In this embodiment, T4 is directly controlled by DATA2 and no scan transistor corresponding to T3 is present. This arrangement allows for the independent control of T1 and T4 within a pixel. It is possible that a switch transistor, similar in function to T2 is added between DATA2 and the gate of T4.

DATA1 and DATA2 can supply the same or different signals and at different times as desired. It is important to note that both T1 and T4 are driving transistors whose purpose is to control the power flowing to the OLED and both will be "on" at the same time during the frame whenever the OLED is providing luminance. In particular, T4 is not a switch transistor that provides a shuttering function; that is, while T1 is regulating the current to the OLED, T4 is also regulating the current to the OLED for some period of time during the frame during which T1 is "on". This arrangement is sometimes referred to as a "Cascode configuration". The shuttering function is only provided by T2 when T3 is set appropriately and the data signal is set for no emission from the pixel (i.e., CV=0).

Figure 10:
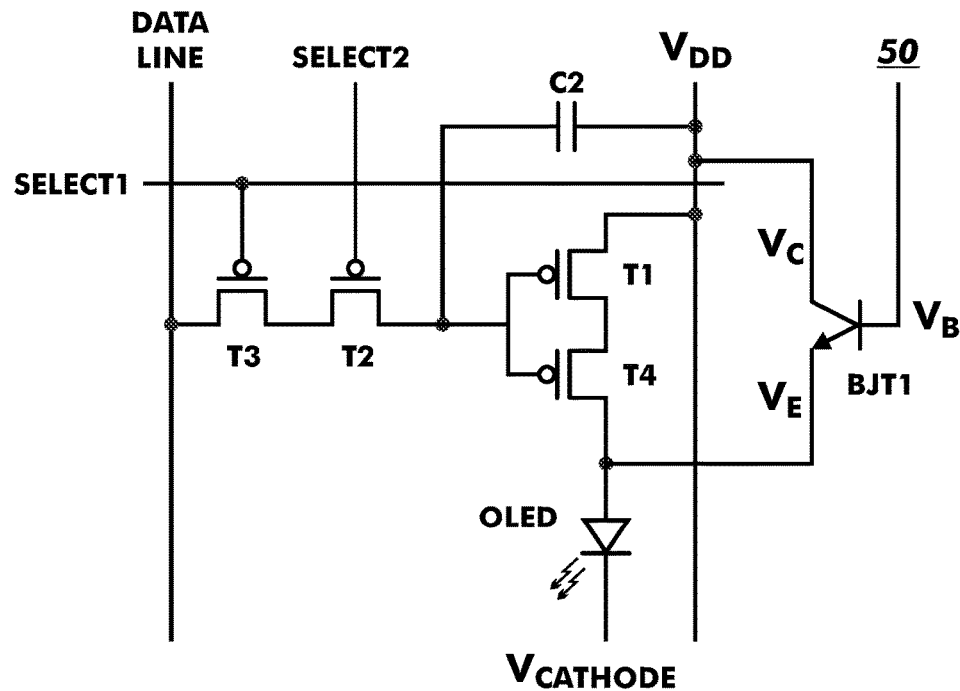
FIG. 10 shows a control circuit with two driving transistors in series controlled by a single data line and the gates of each of the two driving transistors are commonly controlled.

FIG. 10 shows a schematic for a control circuit with two drive transistors in series where the gates of two drive transistors (T1 and T4) are controlled by a single common signal from the data line. In FIG. 10, this signal is controlled by T3 and T2 (similar to in FIG. 3) and applied to the gates of both T1 and T4 simultaneously.

Figure 11:
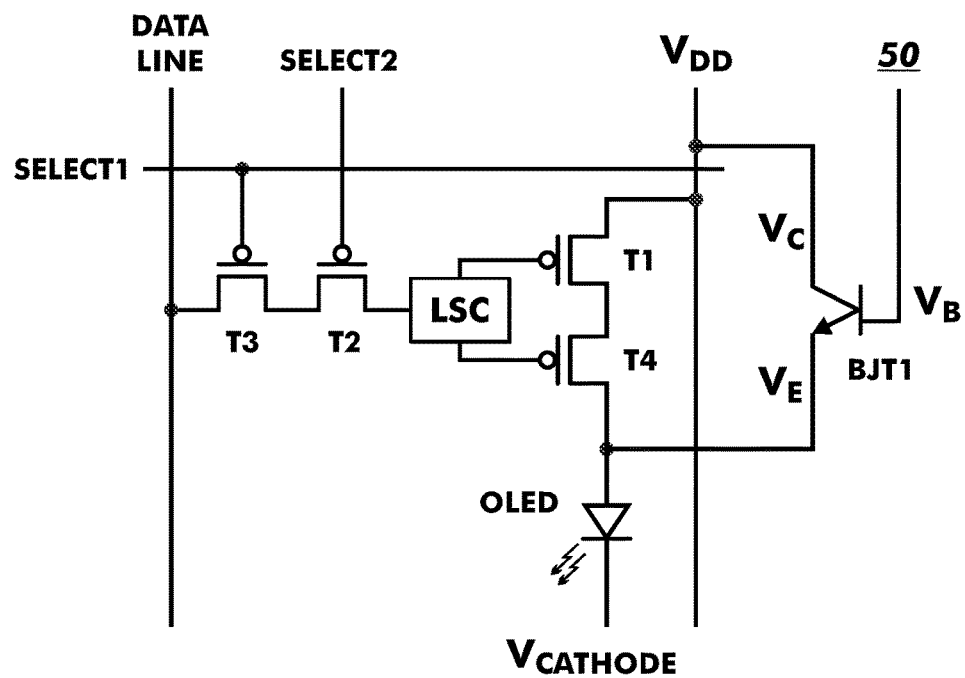
FIG. 11 shows an alternative arrangement of FIG. 10 which includes an LSC.

However, in some embodiments, it may be desirable to ensure that the desired gate voltages are applied to both T1 and T4 to achieve the functions described below, even though only one common data line is present in the circuit. As shown in FIG. 11, this can be accomplished used a level shift circuit (LSC) between the terminal of T2 and the gates of T1 and T4. A level shift circuit is a circuit used to translate signals from one logic level or voltage domain to another and is often used to resolve the voltage incompatibility between various parts of a system. For clarity, neither the internal components nor all of the connections (e.g., $V_{DD}$, ground and other possible input connections or components such as a capacitor are not shown) to the LSC are shown. The LSC sets the gate voltages for the drive transistors T4 and T1 based on the signals from the data line and SELECT1 so that the total voltage across T4 and T1 is split approximately equally between the two drive transistors at all times. As known, small logic transistors can be used for this function. In other embodiments (not shown), it may be desirable to divide the signal unequally so that the voltages at the gates of T1 and T4 are different with some ratio between them. The LSC or similar circuitry can be used to perform this operation.

In the above embodiments with two driving transistors in series, the shuttering transistor T2 for the drive transistor(s) is optional. In embodiments where there are two or more drive transistors in series, they can be a combination of both LV and MV transistors. Preferably, they are all LV transistors to decrease the size of the pixel circuit. In some embodiments, it is also desirable that all transistors in the drive circuit are p-channel transistors. These multiple transistors can be p-channel, n-channel or a mixture. It is preferred that all are p-channel. If there is a mix of n-channel and p-channel transistors, then preferably there is at least one drive transistor that is a p-channel transistor and more preferably, it is a LV transistor. In the case that the any of the multiple transistors in series are of one type, then the multiple common transistors of the same type can share the same well to reduce the size of the design. However, to expand the operating range of the backplane circuit while observing the voltage limitations of the individual transistors, it may be necessary to put the transistors of the same type in separate well regions.

It is desirable that there should be no intervening transistors other than drive transistors in the electrical connection between the power source, and the bottom electrode of the OLED. By intervening, it is meant that in the electrical connection between the power source and the OLED, the current does not pass directly through another transistor (i.e., through the terminals such as the source and drain of a p-channel transistor) connected to the drive transistor while the other terminal is connected to the OLED so that current would pass through the intervening transistor at some point during the operation of the OLED) other than a driving transistor. It is desirable that there is one and only one transistor directly in-line (meaning that the power flows though the terminals (i.e., source and drain if p-channel) of the transistor) between the power source and the bottom electrode of the OLED. This minimizes the oversize of the control circuitry since are fewer components. There may be other (non-transistor) microelectronic components that are in-line between the driving transistor and the OLED or the power source.

There can be a branching (meaning not directly in-line) connection between the driving transistor-OLED connection and a first terminal of a microelectronic component (i.e., a non-intervening transistor or diode) where the OLED operating current does not directly pass-through the non-intervening transistor or diode. This is in addition to the node, which is between the driving transistor and the bottom electrode of the OLED, through which the BJT of the protection circuit is attached.

Other components in the control circuitry may contribute to the control of the current being supplied by the driving transistor, either the current intended to power the OLED when "on" or current leakage through the driving transistor when the OLED is intended to be "off". Moreover, other microelectronic components such as other transistors, capacitors and resistors may be included in this control circuit as necessary. In particular, it is noted that variations in the threshold voltage ($V_{th}$), carrier mobility, or series resistance will directly impact the uniformity of the current of OLED driving transistor and consequently the brightness of the display. One major factor affecting the non-uniformity current is the threshold voltage ($V_{th}$) variation of the OLED drive transistors. Other types of compensation by the control circuitry may be needed for the pixels; for example, aging, degradation or burn-in of the OLED materials over time, mura or non-uniformity across the active area, or voltage drop in the metal connecting lines. In addition, the control circuitry provided by the transistors may need to control the timing of the current delivered to the pixels as, for example, by PWM. The design of control circuitry for OLEDs that includes various types of compensation and driving schemes has been a subject of intense interest and many approaches have been proposed. Such compensation circuits may additionally be present in the control circuitry in addition to the protection circuit as described. The protection circuit may also be designed to prevent other undesirable effects such as short protection, electrostatic discharge, transient spikes, etc.

in addition to maintaining a minimum voltage at the bottom electrode below the threshold voltage of the OLED by including other appropriate circuit components. However, in some instances, it may still be useful to include such known types of protection circuitry in the pixel circuit when using the stacked OLEDs of the invention.

In the control circuitry, the power from the external power source may be delivered to the driving transistor as a variable current or voltage in order to drive the OLED stack to deliver the desired level of luminance. This is often stored during the writing operation by charging a storage capacitor. The power level may be controlled at the external power source or if the power delivered is constant, the power may be set at the appropriate level by other microelectronic circuits within the backplane. This is called "current control" and is typically used to power most OLED devices. Alternatively, the power supplied to the OLED stack can be constant and the total amount of light emission over a set period of time (the frame) is controlled by the time that the OLED pixel is fully "on" compared to the time it is "off". This is called pulse width modulation or PWM control.

Because the control circuit as described is able, without significant leakage or damage, to handle higher voltage and current demands than the designed or rated voltage of at least the driving transistor, the use of OLED stacks with increased amounts of emission (and higher voltages) is enabled. In order to provide the necessary luminance, the OLED stack should have a minimum of least two OLED light-emitting units (often referred to as "tandem" OLED devices). However, tandem OLED devices may still not provide enough luminance as desired. For this reason, OLED stacks with three or more OLED light-emitting units can be used, although they have relatively higher $V_{th}$ requirements than tandem OLED stacks. The circuit as described can be used with a stacked light emitting OLED having a threshold voltage ($V_{th}$) of greater than 7.5V; more desirably, the $V_{th}$ of the light emitting OLED stack is at least 10V or greater. Alternatively, the circuit can be used with a stacked OLED that provides a full-color microdisplay with a light emission of at least 2500 nits or preferably at least 5000 nits.

There are two basic approaches to making a pixelated OLED display where it is necessary to control the brightness of each individual pixel by supplying power to one of the pixel electrodes via control circuitry on a backplane. The first approach involves having each pixel individually produce red, green or blue light (R, G, B respectively) or the same color if it is a monochromatic display. In this case, the light emitting OLED stack can be arranged so that all of the stacked light-emitting units above an individual bottom electrode segment emit the same color of light (selected from R, G or B light) in order to make R, G and B pixels. In some embodiments with this feature, each color pixel forms a microcavity where the distance between the segment bottom electrode and the top electrode depends on the color of light emitted. In this case, the length of the microcavity will depend on the color emitted and will be different for red, green and blue pixels.

The second approach is to have a common multimodal (white) light emitting OLED layer across all pixels with a color filter array (CFA) in order to produce individual RGB pixels. The second approach has an advantage over the first in that it is not necessary to create individual OLED pixels of different formulations and so, manufacturing costs will be reduced.

The number of individual OLED light-emitting units within the stacked OLED is limited only by the overall thickness of the OLED and the ability of the control circuitry to handle the required power to operate the OLED. As the number of OLED units increase, the total amount of light emitted increases, but the thickness of the package, the complexity of the manufacturing process and the threshold voltage all increase as well. An OLED with at least three stacked light-emitting units will provide increased luminance over a tandem (two OLED units) OLED. However, OLEDs with at least four stacked OLED light-emitting units are preferred and more preferably, OLEDs with at least five stacked OLED light-emitting units. An OLED with as many as six to ten or more stacked OLED light-emitting units can be contemplated.

In order to minimize increases in the required voltage to drive an OLED stack, charge generation layers (CGLs; sometimes also referred to as connector or intermediate layers) are located between the individual OLED light-emitting units. This is because the CGLs are structured so that electrons and holes are generated upon voltage application, and injected to the adjacent organic emissive layers. Hence, the use of a CGL can possibly convert one injected electron to multiple photons, allowing for higher luminance. In particular, it is desirable that a CGL is located between each light-emitting unit within the stack. However, it is not necessary for a light-generating unit to have an adjacent CGL on both sides. The OLED light-generating units on the top and bottom of the stack will generally have only one adjacent CGL. There is typically no need to use a CGL between a light-emitting unit and one of the top or bottom electrodes, although a CGL could be used if desired.

Many different kinds of CGLs have been proposed and may be used in the OLED stack. For example, see U.S. Pat. No. 7,728,517 and US 2007/0046189. For the formation of a CGL, an n-p semiconductor heterojunction, which is located at the interface of n-type and p-type layers, is typically needed for the charge generation. Thus, CGLs will have two or more layers. For example, n-doped organic layer/transparent conductive layer, n-doped organic layer/insulating material, n-doped organic material layer/metal oxide layer, and n-doped organic material layer/p-doped organic material layer have all been reported. A desirable metal oxide for CGLs is $MoO_3$. In some instances, the n-layer and p-layer may be separated by a thin intermediate layer. Often, the CGL is arranged so that the n-layer is closer to the anode and the p-layer is closer to the cathode.

One desirable formulation for a CGL has three layers; an electron-transport material doped with a n-dopant (for example, Li), a thin intermediate layer of the same (but undoped) electron-transport material, and a hole-transport material doped with a p-dopant. Suitable electron-transport and hole-transport materials, along with n-dopants and p-dopants suitable for use in a CGLs are well-known and commonly used. The materials may be organic or inorganic. The choice of appropriate materials is not critical and any may be selected based on their performance. The thickness of the CGL should desirably be in the range of 200-450 Å. In many instances, the CGL will have an ETL on the anode side and an HTL on its cathode side to help improve charge transport and help separate the charge-generating dopants (if present) from the LEL in the light-emitting units.

Although the use of CGLs helps to minimize the voltage increase when the OLED light-emitting units are stacked on top of each other, the total voltage required by the stack still increases by approximately the voltage required by each individual unit alone.

Figure 12:
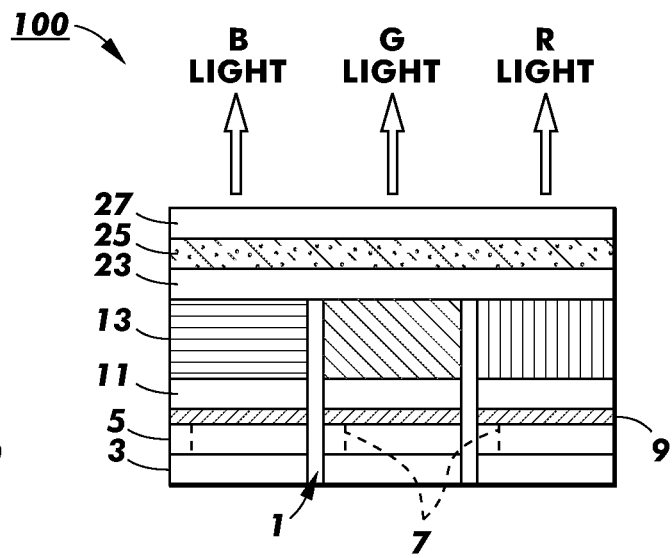
FIG. 12 shows a cross-sectional view of a single RGB microdisplay 100 with three laterally adjacent monochromatic RGB OLED stacks, each individual stack having only one OLED light-emitting units.

In one embodiment, all of the OLED light-emitting units within the OLED stack above an individual bottom electrode segment emit the same color; for example, red, green or blue. This results in a pixelated RGB display. FIG. 12 illustrates a single display 100 that uses three different OLED subpixel stacks to create R, G and B pixels. Each OLED subpixel stack contains only one OLED light-emitting unit and lacks a CGL.

In display 100, there is a silicon backplane 3 which comprises an array of control circuits such as shown in FIGS. 2-7 as well as other necessary components that will supply power to the subpixels according to an input signal. Over the layer 3 with the transistors and control circuitry, there can be an optional planarization layer 5. Over layer 5 (if present), are individual first electrode segments 9 which are connected by electrical contacts 7, which extend though the optional planarization layer to make electrical contact between the individual bottom electrode segments 9 and the control circuitry in layer 3. The individual bottom electrode segments 9 are electrically isolated from each other laterally by a pixel definition layer 1. Over the segmented bottom electrode segments 9 are non-light-emitting OLED layers 11, such as electron- or hole-injection (EIL or HIL) or electron- or hole-transport (ETL or HTL) layers. A light-emitting OLED unit 13 (the OLED unit in each stack will emit a different color; i.e., B, G or R) is over OLED layers 11. Over the light-emitting unit 13 are nonlight-emitting OLED layers 23, such as electron- or hole-transport layers or electron- or hole-injection layers, and transparent top electrode 25 through which light can be transmitted. The OLED microcavity is protected from the environment by an encapsulation layer 27. In the embodiment shown, all organic layers within a single OLED stack are separated horizontally from the adjacent stack by a pixel definition layer 1 but the top electrode 25 and the encapsulation 27 are in common and extend across the entire active area. However, the top electrode 25 need not be continuous and can be segmented if desired. This particular microdisplay is not a microcavity device; however, similar pixelated RGB designs using a microcavity effect can be used.

Figure 13:
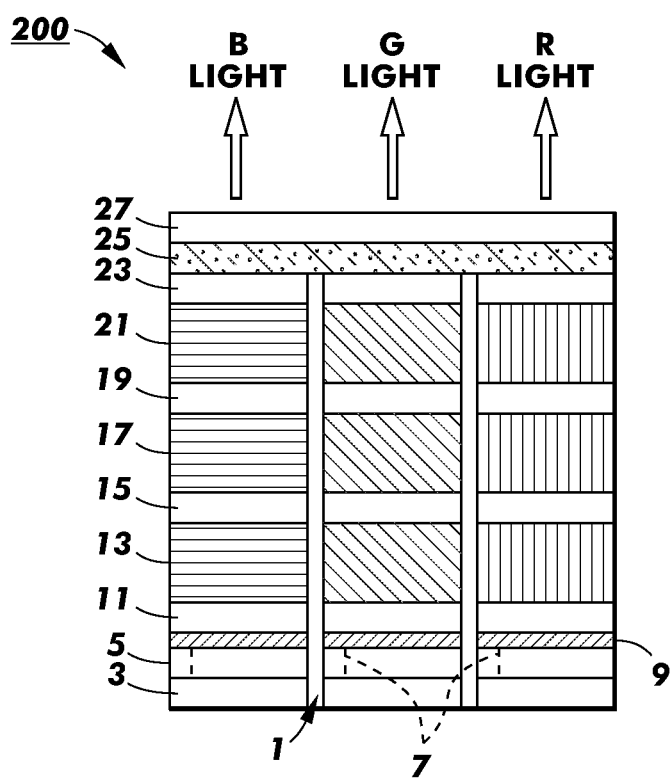
FIG. 13 shows a cross-sectional view of a RGB microdisplay 200 with three laterally adjacent monochromatic RGB OLED stacks, each individual stack having three OLED light-emitting units.

FIG. 13 shows a similar RGB pixelated OLED stack 200 which has three light-emitting units and three laterally adjacent monochromatic RGB OLED stacks. It is a three-stack device. In 200, over the first light-emitting unit 13, there is a first charge-generating layer 15, a second light-emitting OLED unit 17, and a second charge-generation layer 19, and a third light-emitting unit 21. The first CGL 15 lies between and separates the first light-emitting unit 13 and the second light-emitting unit 17 and the second CGL 19 lies between and separates the second light-emitting unit 17 and the third light-emitting unit 21. The remainder of the OLED stack is the same as in 100. In 200, each of the light-emitting units 13, 17 and 21 in the same stack each emit the same color to create individual RGB pixels.

One well-known method of increasing the luminance and color purity of OLED emission is by taking advantage of the optical microcavity effect. This effect is based on creating an optical resonator between a reflecting surface and a semi-reflective surface which allows some light to pass. Multiple reflections between the two surfaces create standing waves, depending on optical distance between the two surfaces, which will intensify some wavelengths of light and decrease others because of constructive and destructive interference effects that will occur depending on whether the emissions are generated at the anti-nodes or nodes, respectively, of the standing waves. The anti-nodes occur at different locations depending on the total space between the reflectors, and on the wavelength being optimized. However, the light emitted from microcavities can show severe angular dependence, where there can be color shifts and loss of luminance as the angle of viewing deviates from perpendicular to the viewing surface. This is often not a problem for NED applications due to the limited entry-angle of the projection optics.

It would be desirable to further increase the luminance of the OLED stacks by using the microcavity effect. For example, the microdisplays 100 and 200 as shown in FIGS. 12-13 could be redesigned to create the microcavity effect by using a reflective bottom electrode or a reflective layer below the bottom electrode, making the top electrode semi-transparent so that it has some degree of reflectivity and adjusting the distance between the uppermost surface of the reflective element (bottom electrode 9 or an underlying reflective layer) and the bottommost surface of the top electrode to create a microcavity suitable for that particular color of light.

Figure 14:
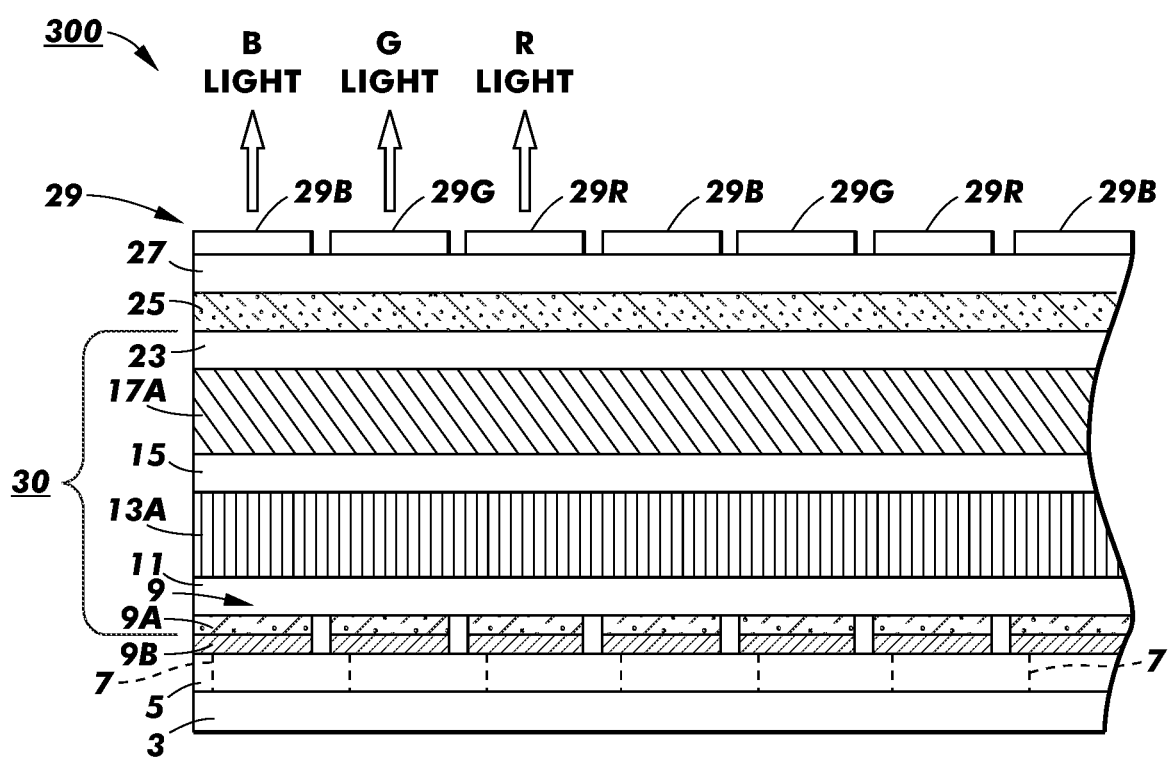
FIG. 14 shows a cross-sectional view of a tandem microdisplay 300 with a multimodal microcavity OLED stack with two OLED light-emitting units and an RGB color filter array.

FIG. 14 illustrates a display 300 that uses a multimodal (white) OLED microcavity that is common across all pixels together with a color filter array (CFA) to create R, G, and B pixels. A multimodal OLED produces more than one color of light. Ideally, a multimodal OLED produces a white light with roughly equal amounts of R, G and B light. Typically, this would correspond to $CIE_x$, $CIE_y$ values of approximately 0.33, 0.33. However, some variation from these values is still acceptable or even desirable depending on the characteristics of the color filters used to create RGB pixels. Display 300 also incorporates the microcavity effect. In this embodiment, the multimodal OLED stack contains two OLED light-emitting units that emit different colors in which each unit is vertically separated from another unit by a CGL where the distance between a reflective surface and the top electrode is constant over the active area. 300 is a tandem (two unit or two-stack) OLED device because it has two light-emitting units separated by a single CGL.

In tandem display 300, there is a silicon backplane 3 which comprises an array of control circuits such as shown in FIG. 2 or 3 as well as necessary components that will supply power to the subpixels according to an input signal. Over the layer 3 with the transistors and control circuitry, there can be an optional planarization layer 5. Over layer 5 (if present), are individual first electrode segments 9 which are connected by electrical contacts 7, which extend though the optional planarization layer to make electrical contact between the individual bottom electrode segments 9 and the control circuitry in layer 3. In this embodiment, the bottom electrode segments 9 have two layers, a reflective layer 9b which is closer to the substrate 1, and an electrode layer 9a which is closer to the OLED layers. The individual bottom electrode segments 9 are electrically isolated from each other laterally. Over the segmented bottom electrode segments 9 are non-light-emitting OLED layers 11, such as electron- or hole-injection or electron- or hole-transport layers. A first OLED light-generating unit 13A is over OLED layers 11. Layer 15 is a first charge-generation layer which lies between and separates the first OLED light-generating unit 13A and a second OLED light-generating unit 17A. Over the second light-emitting unit 17A are non-light-emitting OLED layers 23, such as electron- or hole-transport layers or electron- or hole-injection layers, and semi-transparent top electrode 25. This forms an OLED microcavity 30 that extends from the uppermost surface of reflective surface 9B to the bottommost surface of the semi-transparent top electrode 25, which is also a semi-reflective electrode. The OLED microcavity is protected from the environment by an encapsulation layer 27. In this embodiment, there is a color filter array with color filters 29B, 29G and 29R which filter the multimodal emission generated by the OLED microcavity 30 so that B, G and R light is emitted according to the power supplied to the underlaying electrode segment 9.

In 300, the first and second light-emitting OLED units 13A and 17A together produce multimodal emission. Both OLED units may each produce white light or one may produce one or more color different from the other so that together they make multimodal emission. For example, one OLED unit (i.e., 13A) may produce B light while the other (i.e., 17A) produces Y(R+G) light.

Although 300 is a tandem device, it may be possible to modify the same basic structure to generate a single unit microcavity device. For example, a single unit multimodal microcavity device could be prepared by replacing CGL 15 with a simple undoped organic interlayer where 13A would then comprise yellow light-emitting OLED layers and 17A would comprise blue light-emitting OLED layers. In such an example, layer 15 would be optional. Alternatively, both layer 15 and the second light-emitting layers 17A could be omitted entirely if light-emitting unit 13A emitted white light. In a white or multimodal emitting device, it is necessary to use color filters to provide pixels of a specific color.

Figure 15:
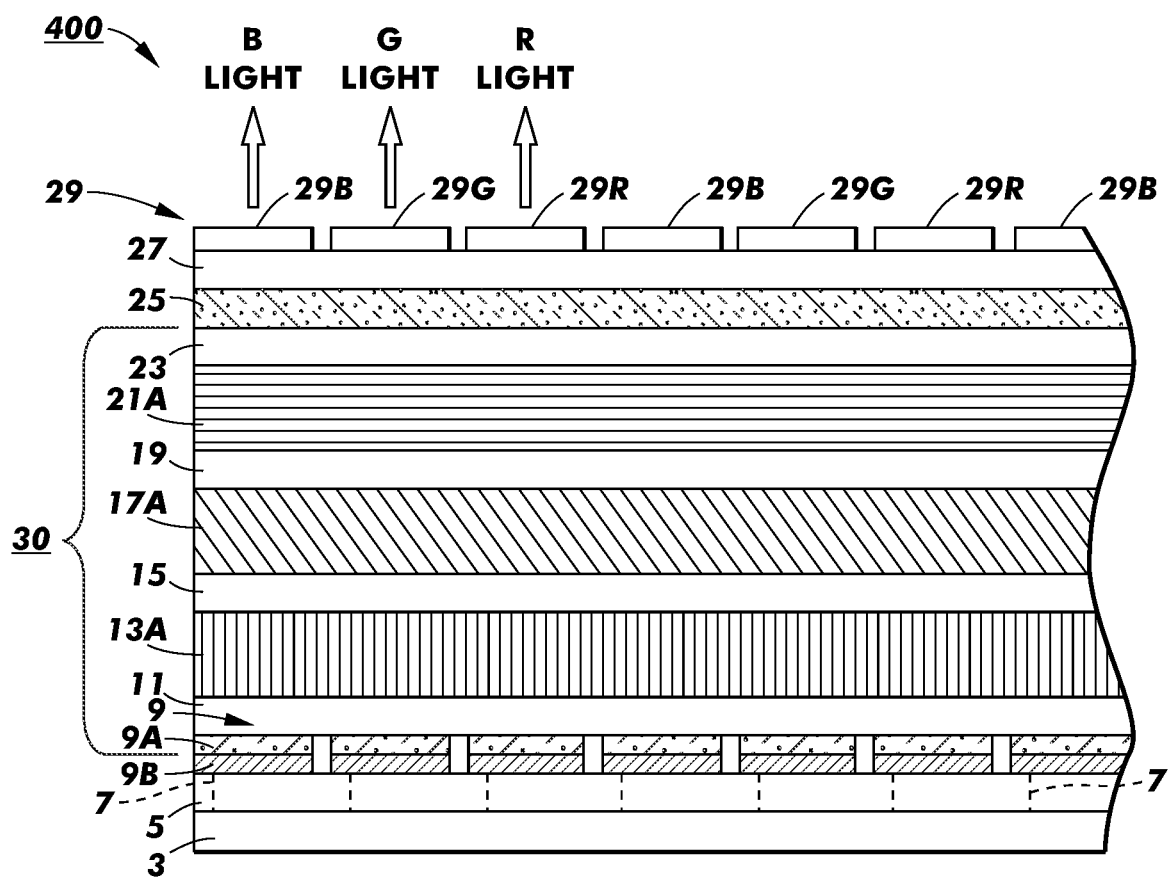
FIG. 15 shows a cross-sectional view of microdisplay 400 with a multimodal microcavity OLED stack with three OLED light-emitting units and an RGB color filter array.

FIG. 15 shows a similar multimodal microcavity OLED stack 400 which has three light-emitting units. In 400, over the second light-emitting OLED unit 17A, there is a second charge-generation layer 19 that lies between and separates the second light-emitting OLED unit 17A and a third light-emitting OLED unit 21A. The remainder of the OLED stack is the same as in 300.

In 400, the first, second and third light-emitting OLED units 13A, 17A and 21A together produce multimodal emission. Each of the OLED units may each produce white light or each may produce one or more colors different from the other two so that together they make multimodal emission. For example, one unit (i.e., 13A) may produce R light, another (i.e., 17A) G light and the third (i.e., 21A) B light. Alternatively, two OLED units may produce B light (i.e., 17A and 21A) while the other one (i.e., 13A) produces Y(R+G) light.

The OLED stacks with two or more OLED light-emitting units as shown in FIGS. 13-15 may be used in displays of any size and can be used with the control circuitry as shown in FIGS. 2-7. However, these OLED stacks with multiple units are also particularly suitable for use as microdisplays in combination with the shuttering function provided by the control circuits shown in FIGS. 3-7.

It is desirable that the driving transistor is a low voltage transistor when the OLED stack comprises three or more OLED light-emitting units. That is, it is designed and sized for safe and effective operation at 5V or less without regard or consideration of the actual load in the circuit. However, if the OLED stack comprises four or more OLED light-emitting units, the operating voltage may be well in excess of 7.5V and the driving transistor or switch transistor can be medium-voltage (for example, designed for 7.5V-12V) or high-voltage (designed for 18-25V) as necessary.

As mentioned previously, the OLED displays and microdisplays are built on a silicon backplane which serves as a substrate. Generally speaking, the backplane will be flat with a uniform thickness. Since silicon backplanes are generally opaque, the OLED stack is preferably top-emitting. However, transparent backplanes are known; in such cases, the OLED stack may be top- or bottom-emitting. The top surface of the substrate is that facing the OLED. The silicon backplane may have various types of subbing layers (i.e., planarization layers, light management layers, light blocking layers, etc.) which may be patterned or un-patterned and can be either on the top or bottom surfaces.

The bottom electrode segments (9 or 9a) can be an anode or a cathode and can be transparent, reflective, opaque or semi-transparent. If the OLED is top-emitting, the bottom electrode can be made of transparent metal oxides or reflective metals such as Al, Au, Ag or Mg or alloys thereof and having a thickness of at least 30 nm, desirably at least 60 nm.

In microcavity applications where the first electrode is over a reflective layer, it should be transparent. However, in other applications, the first electrode layer 9a and 9b can be collapsed into a single reflective electrode so that its uppermost reflective surface forms one side of the optical microcavity (i.e., 30 in FIG. 14).

When the OLED stack is a top-emitting microcavity and the bottom electrode is transparent, there should be a reflecting layer under the bottom electrode that defines a first side of the microcavity 30. When a transparent anode is located over a reflective surface, it is part of the optical cavity. The reflective layer 9b can be a reflective metal such as Al, Au, Ag, Mg, Cu or Rh or alloys thereof, a dielectric mirror or a high-reflection coating. Dielectric mirrors are constructed from multiple thin layers of materials such as magnesium fluoride, calcium fluoride, and various metal oxides, which are deposited onto the substrate. High-reflection coatings are composed from multiple layers of two materials, one with a high index of refraction (such as zinc sulfide (n=2.32) or titanium dioxide (n=2.4)) and one with a low index of refraction (such as magnesium fluoride (n=1.38) or silicon dioxide (n=1.49)). The thicknesses of the layers are generally quarter-wave in terms of wavelength to the light being reflected. It is desirable that the reflective layer reflect at least 80% of the incident light and most preferably, at least 90%. The preferred reflective layer is Al or Ag, with a thickness of 300-2000 Å, most preferably 800-1500 Å.

Desirably, when the OLED stack is bottom-emitting, the bottom electrode is a transparent anode and should transmit as much visible light as possible, preferably having a transmittance of at least 70% or more desirably at least 80%. While the bottom transparent electrode may be made of any conductive materials, metal oxides such as ITO or AZO or thin layers of metals such as Ag are preferable. Poorly conducting materials (e.g., TiN) can be used providing they are made thin.

Electron-transport and hole-transport materials suitable for use in non-emitting layers (i.e., 11 and 23 in FIG. 12) such as hole-injection layers, hole-transport layers or electron-injection layer or electron-transport layers are well-known and commonly used. These layers may be mixtures of such materials and may contain dopants to modify their properties. Since they are non-light emitting, they do not contain emitting materials and are transparent. The choice of appropriate materials is not critical and any may be selected based on their performance.

In embodiments that utilize the microcavity effect, it is typically necessary to select the thickness of various non-light-emitting layers to provide the desired spacing, since the spacing between the various OLED units within the microcavity as well as the size of the microcavity are important to maximize efficiency. Desirably, the adjustment of the spacing between the OLED units as well as the size of the microcavity is provided by using the appropriate thickness of the organic non-emitting layers such as hole transport layers.

Light-emitting layers typically have a host material (or a mixture of host materials), which is the primary component of the layer, and a light-emitting compound. Desirably, the light-emitting compounds are phosphorescent as these have higher efficiency. However, in some instances, some LELs may use fluorescent or TADF (thermally activated delayed fluorescent) compounds as materials for light emission while others use phosphorescent materials. In particular, the blue light-OLED layers may use fluorescent or TADF compounds or combinations thereof while non-blue light-emitting layers may use green, yellow, orange or red phosphorescent compounds or combinations therefor. Light-emitting layers may use combinations of light-emitting materials. The choice of appropriate materials for LELs is well known, is not critical, and any may be selected based on their performance and emission characteristics. When using phosphorescent emitters, it is sometimes necessary to confine the excitons generated by the phosphorescent emitter within the layer. Thus, exciton-blocking layers on either side, or both, of the phosphorescent LEL can be used if necessary. Such materials and their application are well known. In addition, it can be desirable to add HBLs (hole-blocking layers) and EBL layers (electron-blocking layers) around the light-emitting layers, particularly blue light-emitting layers to improve lifetime and luminance efficiency.

The top electrode (i.e., 25 in FIG. 12) should be transparent if the OLED stack is top-emitting, reflective if the OLED stack is bottom-emitting and in the case where the OLED stack is a microcavity, semi-transparent as well as semi-reflective: that is, it reflects part of the light and transmits the rest. In the case of a microcavity, the bottom-most internal surface of the top electrode defines a second side of the microcavity 30. Desirably, the semi-transparent top electrode reflects at least 5%, and more desirably, at least 10% of the light emitted by the LELs in order to establish the microcavity effect. The thickness of the semi-transparent $2^{nd}$ electrode is important since it controls the amount of reflected light and how much is transmitted. However, it cannot be too thin since then it may not be able to efficiently pass charge into the OLED or be subject to pinholes or other defects. A thickness of the upper electrode layer is desirably 100-200 Å, and more desirably 125-175 Å.

The top electrode is desirably a thin layer of metal or metal alloy. Suitable metals include Ag, Mg, Al and Ca or alloys thereof. Of these, Ag is preferred because it has relatively low blue absorption. In order to help with electron transport as well as stabilization, there may an adjacent layer of transparent metal oxide on the electrode surface such as ITO, InZnO or $MoO_3$. Alternatively, metal halides such as LiCl, organometallic oxides such as lithium quinolate, or other organic materials could be used.

There may be protective or spacing layers (not shown in FIGS. 8-11) over the upper electrode to prevent damage during encapsulation.

Over the top electrode 25 and any optional protective layers, if present, is deposited or placed encapsulation 27. At a minimum, the encapsulation should fully cover the light-emitting area on the top and sides and is in direct contact with the substrate. The encapsulation should be impervious to air and water penetration. It may be transparent or opaque. It should not be electrically conductive. It may be formed in-situ or added as a separate pre-formed sheet along with provisions for sealing the side edges. An example of in-situ formation would be thin-film encapsulation. Thin-film encapsulation involves the deposition of multiple layers with alternative layers of inorganic materials and polymeric layers until the desired degree of protection is achieved. Formulations and methods to form thin-film encapsulation are well known and any can be used as desired. Alternatively, encapsulation may be provided using a pre-formed sheet or cover slip which is attached over at least the sealing area and enclosed area. The pre-formed sheet may be rigid or flexible.

It could be made of glass (including flexible glass), metal or organic/inorganic barrier layers. It should have a thermal expansion coefficient that is close to the substrate to achieve a more robust connection. Pre-formed encapsulation sheets may need to be attached over the sealing area using air and water proof adhesives such as silicon or epoxy adhesives or by thermal means such as ultrasonic welding or glass frit welding, which may require additional sealants such as solder or glass frit. The side and bottom edges of the cover slip can be specially designed to have better fit to the sealing area or promote a better seal. The cover slip and sealing area may be designed together so that they fit or lock partially in place before the seal is formed. Moreover, the cover slip may be pretreated to promote better adhesion to the sealing area.

Although this application describes the use of OLEDs as the light-emissive elements in a display, the same control circuit can be used in any self-emissive display technology that would require relatively high voltages for light emission. The invention is not limited to only OLEDs but any other display technology that would require greater than 5V, preferably greater than 7.5V, or even greater than 10V to provide light emission of at least 1000 nits or preferably at least 5000 nits.

The displays with the control circuit in the silicon backplane may be of any size and can be used in many different applications; e.g., billboards and advertising displays, televisions, mobile applications such as cell phones or vehicle interiors.

The above description describes a number of different embodiments which may involve different combinations of different individual features. Individual features from any of the embodiments may be combined in any order or extent without limitation as desired, except when incompatible.

In the above description, reference is made to the accompanying drawings that form a part hereof, and in which are shown by way of illustration specific embodiments which may be practiced. These embodiments are described in detail to enable those skilled in the art to practice the invention, and it is to be understood that other embodiments may be utilized and that structural, logical and electrical changes may be made without departing from the scope of the present invention. The description of any example embodiments is, therefore, not to be taken in a limiting sense. Although the present invention has been described for the purpose of illustration, it is understood that such detail is solely for that purpose and variations can be made by those skilled in the art without departing from the spirit and scope of the invention.

PARTS LIST

MP1 Switch transistor
MP2 Driving transistor
C1, C2, Capacitors
$V_{DD}$, $V_{DD2}$, 50 External power sources
SELECT1-SELECT3 Select lines
T1 First driving transistor
T2 Switch transistor
T3 In-line selecting (scan) transistor
T4 Second driving transistor
T5 In-line selecting (scan) transistor
T6 Switch Transistor
$V_{CATHODE}$ Cathode voltage
IBD1-IBD6 Intrinsic body diodes
$V_{PROTECT}$ External voltage source
$I_{PROTECT}$ External current source
$V_{REF}$ Reference voltage $I_{REF}$ Reference current
BJT1 Bipolar junction transistor
$V_C$ Collector Voltage
$V_E$ Emitter Voltage
$V_B$ Base Voltage
LSC Level shift circuit
Pixel Definition Layer
1 Silicon backplane
3 Optional planarization layer
5 Electrical contacts
7 First electrode segments
9A First electrode layer
9B Reflective layer
11, 23 Non-light-emitting OLED layers
13 First light-emitting OLED unit
13A Lower light-emitting OLED unit
15, 19, 24 Charge generation Layers
17 Second Light-emitting OLED unit
17A Second light-emitting OLED unit
21 Third light-emitting OLED unit
21A Upper light-emitting OLED unit
25 Top electrode
27 Encapsulation
29 Color Filter Array
29B Blue color filter
29G Green color filter
29R Red color filter
20 Microcavity
100, 200 RGB Pixelated OLED
300, 400 Multimodal OLED microcavity device

The invention claimed is:

1. A display comprising a light emitting OLED stack on top of a silicon-based backplane with individually addressable pixels and control circuitry wherein:
the control circuitry of the silicon-based backplane comprises at least one driving transistor where a first terminal of the driving transistor is electrically connected to an external power source $V_{DD}$, and the second terminal of the driving transistor is electrically connected to a segmented bottom electrode of the OLED stack; wherein the gate of the driving transistor is controlled by a data signal which is supplied by a scan transistor controlled by a signal from a first select line; and
the control circuitry additionally comprises a protection circuit comprising a bipolar junction transistor with a collector terminal electrically connected to external power source $V_{DD}$.

2. The display of claim 1 wherein there is a switch transistor between the scan transistor and the gate of the driving transistor where the gate of the switch transistor is controlled by a signal from a second select line, which is different from the first select line.

3. The display of claim 1 wherein the driving transistor is rated at 5V or lower.

4. The display of claim 2 wherein the driving and switch transistor are both p-channel transistors.

5. The display of claim 1 wherein the OLED stack comprises a single OLED light-emitting unit between the segmented bottom electrode and a top electrode.

6. The display of claim 5 wherein the OLED stack forms a microcavity where the physical distance between the segmented bottom electrode and the top electrode is constant across all pixels.

7. The display of claim 5 wherein the top electrode is transparent or semi-transparent so that the OLED stack is top emitting.

8. The display of claim 1 wherein the OLED stack comprises two or more OLED light-emitting units between the segmented bottom electrode and a top electrode.

9. The display of claim 8 wherein the OLED light-emitting units are each separated from each other by a charge-generation layer (CGL).

10. The display of claim 8 wherein the OLED stack forms a microcavity where the physical distance between the segmented bottom electrode and the top electrode is constant across all pixels.

11. The display of claim 8 wherein the top electrode is transparent or semi-transparent so that the OLED stack is top emitting.

12. The display of claim 1 wherein the bipolar junction transistor is an NPN transistor wherein the base is connected either to a voltage source $V_{PROTECT}$ or a current source $I_{PROTECT}$, the emitter is connected to a node connected to the bottom electrode of the OLED stack and the collector is connected to external power source.

13. The display of claim 1 wherein the bipolar junction transistor is an NPN transistor wherein the base is isolated, the emitter is connected to a node connected to the bottom electrode of the OLED stack and the collector is connected to external power source.

14. The display of claim 1 wherein the bipolar junction transistor is located in a separate well from the driving transistor.

15. The display of claim 1 wherein there is a switch transistor connected in parallel to the scan transistor between the data line and the gate of the driving transistor where the gate of the switch transistor is controlled by a signal from a second select line, which is different from the first select line.

16. The display of claim 15 where the driving transistor is rated at 5V or lower.

17. The display of claim 15 wherein the driving and switch transistor are both p-channel transistors.

18. The display of claim 1 wherein there are two or more driving transistors in series where the first terminal of first driving transistor is electrically connected to an external power source $V_{DD}$, and the second terminal of the last driving transistor is electrically connected to a segmented bottom electrode of the OLED stack.

19. The display of claim 1 where the emitter terminal of the bipolar junction transistor is electrically connected to a node between the driving transistor and the segmented bottom electrode of the OLED stack.

20. The display of claim 1 where the base terminal of the bipolar junction transistor is electrically connected to a power source.

21. The display of claim 20 where the power source is either a voltage source $V_{PROTECT}$ or a current source $I_{PROTECT}$.

22. The display of claim 1 wherein the collector terminal is electrically connected to a node between the external power source $V_{DD}$ and the driving transistor.

* * * * *